United States Patent [19]

Otvos

[11] Patent Number: 4,933,844

[45] Date of Patent: Jun. 12, 1990

[54] MEASUREMENT OF BLOOD LIPOPROTEIN CONSTITUENTS BY ANALYSIS OF DATA ACQUIRED FROM AN NMR SPECTROMETER

[76] Inventor: James D. Otvos, 1827 E. Kenmore Pl., Shorewood, Wis. 53211

[21] Appl. No.: 248,750

[22] Filed: Sep. 26, 1988

[51] Int. Cl.$^5$ .............................................. G06F 15/42
[52] U.S. Cl. ........................... 364/413.08; 128/653 R; 435/111; 436/87
[58] Field of Search ................................... 364/413.08; 324/307–309; 436/87, 171–173; 435/111; 422/68; 128/653

[56] References Cited

U.S. PATENT DOCUMENTS

| | | | |
|---|---|---|---|
| Re. 28,803 | 5/1976 | Durkos et al. ................. | 364/413.11 |
| 3,950,135 | 4/1976 | Whitesides et al. ................ | 436/173 |
| 4,224,031 | 9/1980 | Mee et al. .......................... | 436/173 |
| 4,720,788 | 1/1988 | Golies ............................ | 364/413.07 |
| 4,728,889 | 3/1988 | Gadian et al. ...................... | 324/307 |
| 4,852,025 | 7/1989 | Herpichböhm ................ | 364/413.08 |

FOREIGN PATENT DOCUMENTS 0234524 9/1987 European Pat. Off. .

OTHER PUBLICATIONS

"A Comparison of High Performance Gel Permeation Chromatography and Nuclear Magnetic Resonance Spectroscopy in the Analysis of Plasma from Normal Subjects and Cancer Patients", G. N. Chmurny et al., Jour. Liq. Chromatography, vol. 11(3), pp. 648–664 (1988).
"H NMR Studies of Human Blood Plasma", J. D. Bell et al., FEBS Letters, vol. 219(1), pp. 239–243 (1987).
"Assessment of Proton Nuclear Magnetic Resonance Spectroscopy for Detection of Malignancy", P. Wilding et al., Clin. Chem., vol. 34(3), pp. 505–511 (1988).
"Analysis of Serum by High-Field Proton Nuclear Magnetic Resonance", Clin. Chem., vol. 28(9), pp. 1873–1877 (1982).
"Correlation of C and H Chemical Shifts in Bovine High-Density Lipoprotein From Two-Dimensional NMR", S. Coffin et al., Jour. Mag. Res., vol. 59, pp. 268–274 (1984).
"A Spatially Selective Composite 90° Radiofrequency Pulse", Ad Bax, J. Magn. Reson. 65, pp. 142–145 (1985).
"Numerical Solution of Equations", F. B. Hildebrand, Intro. to Numerical Analysis, Chapter 10, pp. 539–567, undated.
"Measuring Cholesterol is as Tricky as Lowering It", Leslie Roberts, Science, vol. 238, pp. 482–483, Oct. 1987.
"The Clinical Significance of Apolipoprotein Measurements", Herbert K. Naito, Jour. of Clin. Immunoassay, vol. 9, No. 1, pp. 11–20, Spring 1986.
"Sequential Flotation Ultracentrifugation", V. N. Schumaker et al., Methods in Enzymology, vol. 128, pp. 155–173 (1986).
"Practical Methods for Plasma Lipoprotein Analysis", F. T. Hatch et al., Advances in Lipid Research, vol. 6, pp. 1–68, 1968.
"The Mobility of Cholesteryl Esters in Native and Reconstituted Low Density Lipoprotein as Monitored by Nuclear Magnetic Resonance Spectroscopy", P. A. Kroon et al., The Jour. of Biological Chem., vol. 256, No. 11, Issue of Jun. 10, pp. 5340–5344, 1981.
"Structure of Human Serum Lipoproteins: Nuclear Magnetic Resonance Supports a Micellar Model", J. M.

(List continued on next page.)

Primary Examiner—Jerry Smith
Assistant Examiner—Gail O. Hayes
Attorney, Agent, or Firm—Quarles & Brady

[57] ABSTRACT

A method and apparatus for analyzing blood plasma to determine the concentration of its lipoprotein constituents, VLDL, LDL, HDL and proteins includes obtaining the NMR chemical shift spectrum of a sample. Stored reference NMR spectra of the lipoprotein constituents are added together to form a lineshape that best fits the measured blood plasma NMR spectrum, and from this, the concentration of each lipoprotein constituent in the blood plasma is determined.

12 Claims, 4 Drawing Sheets

OTHER PUBLICATIONS

Steim et al., Science, vol. 162, pp. 909–911, Nov. 22, 1968.

"High-Resolution NMR Spectra of High-Density Serum Lipoproteins", D. Chapman et al., Biochim. Biophys. Acta, 176 (1969), pp. 524–536.

"Analysis of Serum by High-Field Proton Nuclear Magnetic Resonance", J. L. Block, Clin. Chem., vol. 28, No. 9, pp. 1873–1877 (1982).

"H NMR Studies of Human Blood Plasma (Assignment of Resonances for Lipoproteins", J. D. Bell et al., FEBS Letters, vol. 219, No. 1, pp. 239–243 (Jul. 1987).

MEASUREMENT OF BLOOD LIPOPROTEIN CONSTITUENTS BY ANALYSIS OF DATA ACQUIRED FROM AN NMR SPECTROMETER

BACKGROUND OF THE INVENTION

The field of the invention is the measurement of lipoprotein levels in blood plasma or blood serum and, more particularly, the levels of low-density lipoproteins (LDL), high-density lipoproteins (HDL) and very low-density lipoproteins(VLDL). These lipoproteins account for the vast majority of the cholesterol found in blood.

The importance of accurately measuring cholesterol levels in blood is well known. The federal government, in combination with more than twenty health organizations, has launched an aggressive campaign, through the National Cholesterol Education Program, to convince physicians and the general population of the dangers of high cholesterol levels in the blood. All persons are urged to have their cholesterol levels checked, and specific treatments are recommended based on the precise measured cholesterol level. In addition, treatments are not based solely on the total cholesterol level, but instead, on the level of LDL cholesterol. LDL cholesterol appears to be the major cause of clogged arteries, whereas HDL cholesterol aids in removing cholesterol deposits. A separate, and more expensive test is required to determine the level of LDL cholesterol and it is usually not conducted unless the measured total cholesterol level is at the borderline or high risk levels.

Current methods for measuring cholesterol levels are notoriously inaccurate and the standard practice is to repeat the measurement a number of times when high levels are detected on the first measurement. Inaccuracies of 5% or more have been found in nearly half of the measurements made by testing laboratories and 15% of the measurements were inaccurate by an amount greater than 10%. These inaccuracies are inherent in the current measurement methods which require considerable handling of the blood and certain presumptions about the ratios of its constituent parts.

Direct quantization of lipoprotein cholesterol is usually achieved by enzymatic assay of the individual lipoproteins, which are separated by ultracentrifugation, electrophoresis, or selective precipitation. There is great variability among the available separation methods in terms of accuracy, convenience, and cost. Generally, the most accurate methods are those involving ultracentrifugation, but these are very time consuming and expensive and therefore not suitable for largescale population studies. The most widely used alternative is an indirect method introduced by W. T. Friedewald, R. I. Levy, and D. S. Fredrickson, in their publication "Estimation of the Concentration of Low-Density Lipoprotein Cholesterol in Plasma, Without Use of the Preparative Ultracentrifuge", Clin. Chem., 18, 499–502 (1972). In this procedure, plasma triglyceride (TG) and total cholesterol (TC) are measured by enzymatic assay. To a separate aliquot of plasma is added one of several reagents which selectively precipitates VLDL and LDL. After removing the precipitate by centrifugation, the supernatant is assayed for cholesterol to provide a measure of HDL cholesterol (HDL-C). An estimate of VLDL cholesterol (VLDL-C) is then made by dividing the plasma triglyceride level by five. The LDL cholesterol (LDL-C) concentration is then calculated by difference: LDL-C=TC− (HDL-C+VLDL-C). Although this method is relatively rapid and inexpensive, there are several steps where experimental error can be introduced, particularly in the precipitation step. In addition, the accuracy of the analysis depends on the assumption that VLDL-C can be reliably estimated as one fifth the concentration of plasma triglyceride. When fasting samples are used, this is generally true, but other formulas have also been suggested to give more accurate values as described by D. M. DeLong, E. R. DeLong, P. D. Wood, K. Lippel, and B. M. Rifkind, in their publication "A Comparison of Methods for the Estimation of Plasma Low- and Very Low-Density Lipoprotein Cholesterol", J. Am. Med. Assoc., 256, 2372–2377 (1986).

SUMMARY OF THE INVENTION

The present invention relates to a method for measuring the lipoprotein constituents of blood using a nuclear magnetic resonance (NMR) technique. More specifically, the method includes acquiring proton NMR data from a sample of blood plasma or serum, processing the acquired NMR data to produce a chemical shift spectrum, and deconvoluting the spectrum in terms of four standard lipoprotein constituent spectra to give the concentration of each of the four lipoprotein constituents. It has been discovered that the spectrum is accurately represented by a linear combination of the spectra of four constituents into which the blood can be fractionated. These four constituents are VLDL, LDL, HDL and protein and their NMR spectral properties have been found to be virtually invariant from person to person. Thus, any differences in the NMR spectra are due entirely to differences in the amplitudes of the constituent spectra, which, in turn, is due to the concentrations of those constituents in the blood.

A general object of the invention is to provide an accurate and reliable measurement of the lipoprotein constituents of blood. Since the observed spectrum of a whole plasma sample is closely simulated by appropriately weighted sums of the NMR spectra of its four lipoprotein constituents, it is possible to extract the concentrations of these constituents in a sample by calculating the weighting factors which give the best fit between the sample spectrum and the calculated spectrum. The handling and processing of the sample is relatively simple compared to prior methods and there is, therefore, less opportunity for error. The sample is merely prepared for the NMR measurement and the measurement is taken at a controlled temperature and at a controlled magnetic field strength.

Another object of the invention is to provide a method for measuring the lipoprotein constituents of blood at an economical cost and on a mass basis. The preparation of the sample is a trivial task and the actual NMR measurement is carried out automatically by an NMR spectrometer in seven minutes or less. The deconvolution calculations are also carried out automatically by a computer which prints out a report that indicates the concentrations of the lipoprotein constituents.

Yet another object of the invention is to improve the accuracy of the deconvolution process by accounting for nonlipoprotein constituents. Standard NMR reference spectra for metabolites such as lactate, valine and hydroxybutyrate are produced and these are used along with the NMR reference spectra for the lipoprotein constituents to deconvolute the sample NMR spectrum.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

Figure 1:
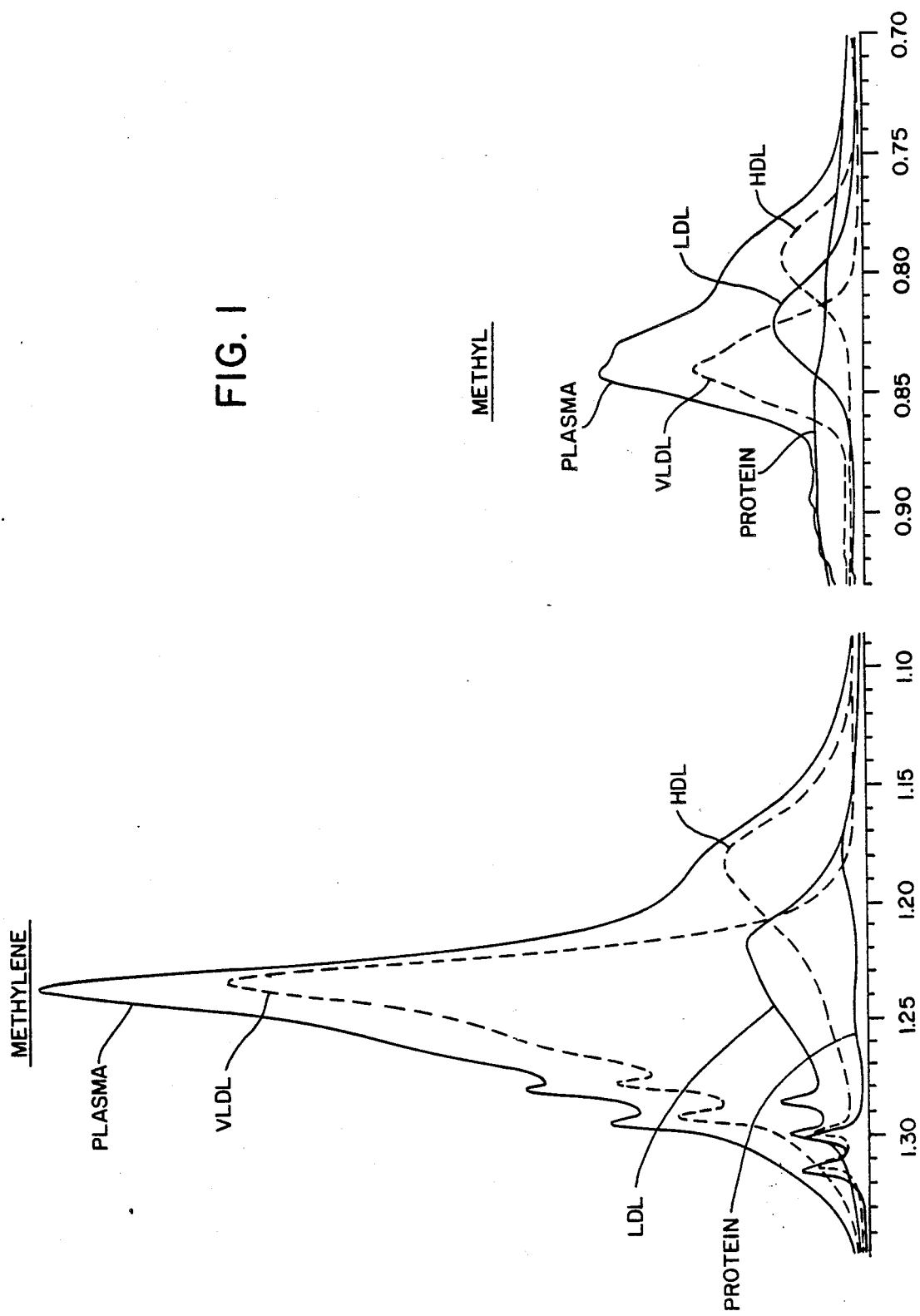
FIG. 1 is a graph showing the chemical shift spectra of a first plasma sample and its lipoprotein constituents.

GENERAL DESCRIPTION OF THE INVENTION $^1$H NMR spectra of human blood plasma contain two prominent peaks centered at approximately 1.2 and 0.8 ppm (relative to the chemical shift standard, TSP). These peaks arise from methylene ($CH_2$) and methyl ($CH_3$) protons, respectively, of plasma lipids. Each of these peaks is very heterogeneous in nature, consisting of overlapping resonances from protons of the several chemically distinct classes of lipids present in plasma: triglycerides; cholesterol; cholesterol esters; and phospholipids. These lipids are packaged together into three major types of lipoprotein particles, which differ in the proportions of lipids which they contain. These lipoprotein particles also differ in density from which their names are derived: very low density lipoprotein (VLDL), low density lipoprotein (LDL), and high density lipoprotein (HDL). Only that fraction of the lipids in these lipoprotein particles that are in a fluid, mobile state (as opposed to an ordered liquid-crystalline state) contribute NMR plasma resonances. The heterogeneity of these signals is reflected by their complex lineshapes, which vary from person to person owing to variations of the plasma concentrations of the different lipoprotein particles, each of which has its own characteristically different NMR spectral properties.

The method of the present invention allows the concentrations of all three lipoprotein particles (VLDL, LDL, HDL) of a plasma sample to be extracted from its $^1$H NMR spectrum by a computer analysis of the lineshapes of its methyl and methylene signals. The method exploits the finding that this region of the observed plasma spectrum is accurately represented by a simple linear combination of the spectra of four constituents into which plasma can be fractionated by differential flotation ultracentrifugation. The four constituents are differentiated on the basis of their density and include: VLDL (density < 1.006); LDL (density = 1.006 to 1.063); HDL (density = 1.063 to 1.21); and "Protein" (density > 1.21). The latter constituent is the mostly protein-containing bottom fraction left behind after flotation of the lipoproteins.

The NMR spectral properties of these constituents have been found to be virtually invariant from person to person. This is illustrated in Table 1 which is the result of a study conducted at the University of Wisconsin-Milwaukee and the Medical College of Wisconsin.

TABLE 1

| 500 MHz NMR Parameters of the Separated Lipoprotein Constituents of Plasma | |
|---|---|
| Parameter | Mean ± SD |
| VLDL | (n = 117) |
| $CH_2$ Chemical Shift (ppm) | 1.233 ± 0.002 |
| $CH_3$ Chemical Shift (ppm) | 0.839 ± 0.002 |
| $CH_2$ Linewidth (Hz) | 20.8 ± 1.9 |
| $CH_3$ Linewidth (Hz) | 16.3 ± 0.8 |
| $CH_2/CH_3$ Intensity Ratio | 3.76 ± 0.29 |
| LDL | (n = 66) |
| $CH_2$ Chemical Shift (ppm) | 1.219 ± 0.005 |
| $CH_3$ Chemical Shift (ppm) | 0.822 ± 0.002 |
| $CH_2$ Linewidth (Hz) | 34.0 ± 2.9 |
| $CH_3$ Linewidth (Hz) | 21.1 ± 1.0 |
| $CH_2/CH_3$ Intensity Ratio | 1.27 ± 0.13 |
| HDL | (n = 70) |
| $CH_2$ Chemical Shift (ppm) | 1.186 ± 0.004 |
| $CH_3$ Chemical Shift (ppm) | 0.796 ± 0.003 |
| $CH_2$ Linewidth (Hz) | 34.4 ± 2.9 |
| $CH_3$ Linewidth (Hz) | 20.0 ± 0.8 |
| $CH_2/CH_3$ Intensity Ratio | 1.58 ± 0.13 |
| PROTEIN | (n = 111) |
| $CH_2/CH_3$ Intensity Ratio | 0.37 ± 0.10 |

Thus, differences among the NMR signals from the plasma of individuals are caused by differences in the amplitudes of the lipid resonances from the four constituents which in turn are proportional to their concentrations in the plasma.

Figure 2:
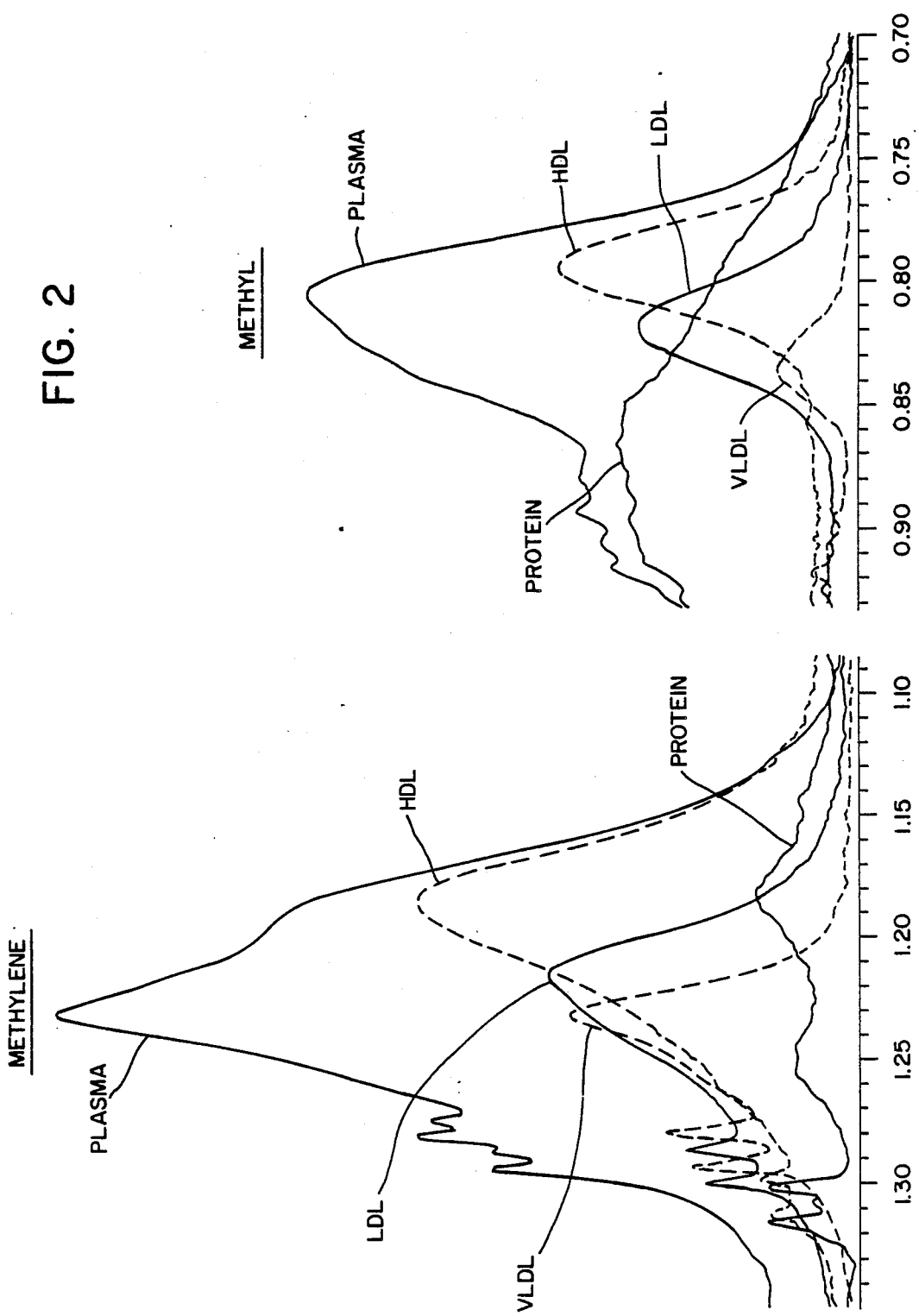
FIG. 2 is a graph showing the chemical shift spectra of a different plasma sample and its corresponding lipoprotein constituents.

This is illustrated in FIGS. 1 and 2 in which the NMR chemical shift spectra of two substantially different blood plasma samples are shown. For the purposes of the present invention, the spectral peaks produced by methylene ($CH_2$) and methyl ($CH_3$) protons are required and they appear in the chemical shift spectral region of 1.33 to 0.70 ppm which is shown along the horizontal axis. Each spectral peak is produced by the arithmetic sum of four NMR signals produced by the blood plasma constituents VLDL, LDL, HDL and proteins. It can be seen that the lineshape of the whole plasma spectrum is altered substantially by the change in relative amounts of its four lipoprotein constituents. However, the lineshapes of the four lipoprotein constituents remain substantially the same, despite the fact that their amplitudes change dramatically with their relative concentrations in the plasma sample. It is the invariant lineshape of the NMR spectra of the four plasma lipoprotein constituents across the entire population and the fact that these lineshapes may be arithmetically added to produce the lineshape of the blood plasma sample, which is the basis for the present invention.

Since the observed $CH_2$ and $CH_3$ lineshapes of whole plasma samples are closely simulated by the appropriately weighted sum of lipid signals of its four lipoprotein constituents, it is possible to extract the concentrations of these constituents present in any sample. This is accomplished by calculating the weighting factors which give the best fit between observed blood plasma NMR spectra and the calculated blood plasma spectra. The process of NMR lipoprotein analysis is thus comprised of the following steps: (1) acquisition of an NMR "reference" spectrum for each of the four pure plasma constituents (VLDL, LDL, HDL, Protein), (2) acquisition of whole plasma NMR spectra using measurement conditions identical to those used to obtain the reference spectra, and (3) computer deconvolution of the plasma NMR spectra in terms of the four constituents to give the concentration of each lipoprotein constituent expressed as a multiple of the concentration of the corresponding lipoprotein reference. The plasma lineshape analysis is accomplished by calculating weighting coefficients for each of the four reference NMR spectra which minimize the sum of squared deviations between the observed plasma NMR spectrum and that which is calculated by summing the four weighted reference spectra.

Figure 3:
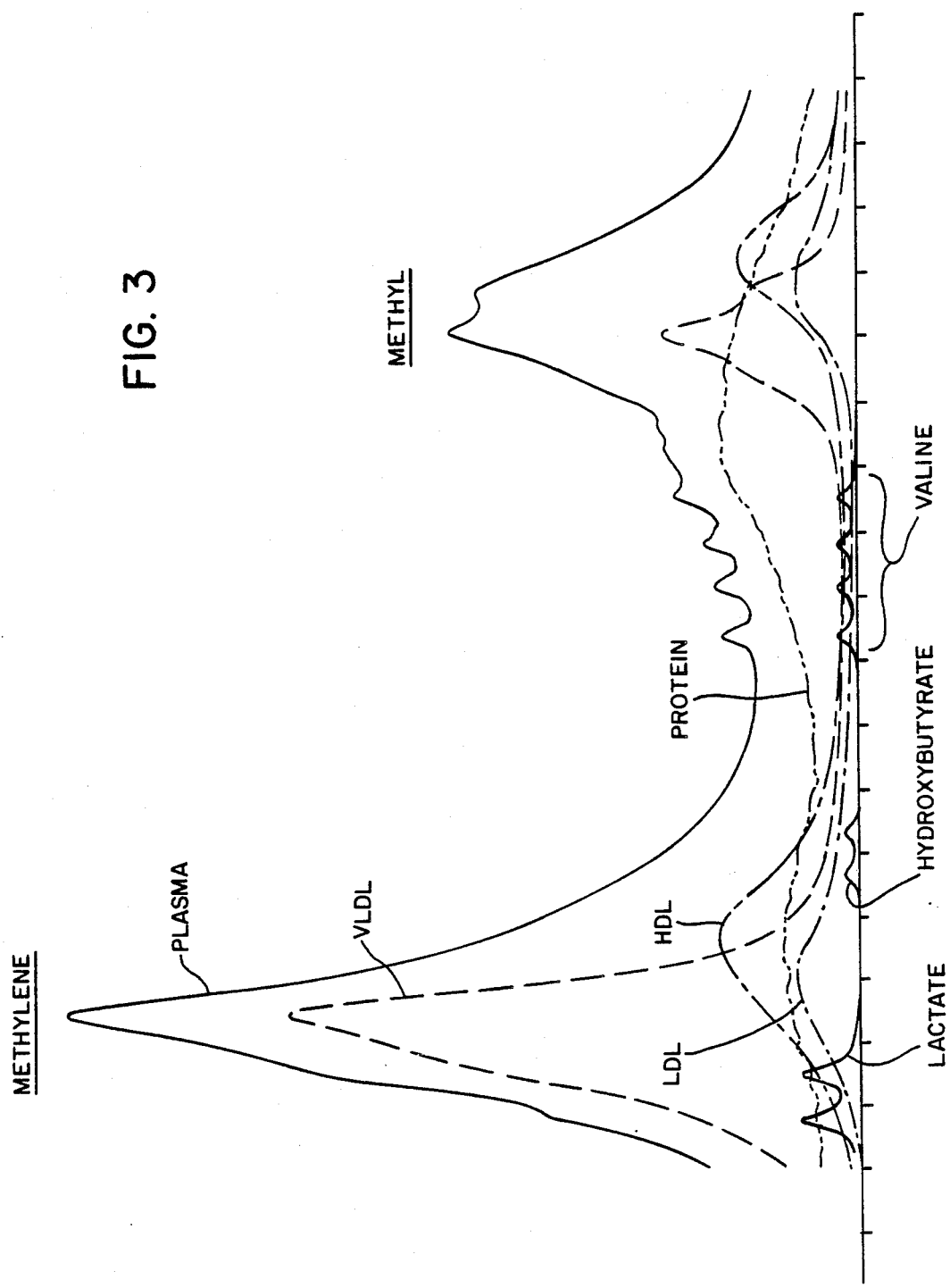
FIG. 3 is a graph showing the chemical shift spectra of a third plasma sample and its corresponding lipoprotein and nonlipoprotein constituents.

While the invention is described herein as being used to analyze blood plasma, it can also be used with equal effectiveness to analyze blood serum. Also, the accuracy of the analysis can be improved if non-lipoprotein constituents are taken into account. While future development may expand the list of such constituents, the NMR signals produced by metabolites such as lactate, valine and hydroxybutyrate are significant and should be included in the analysis. The contribution of these constituents to the NMR signal of blood plasma is illustrated in FIG. 3, and although they are very small when compared to the lipoprotein constituents, they do affect the accuracy of the deconvolution process.

DESCRIPTION OF THE PREFERRED EMBODIMENT

Blood is collected from donors who have fasted for 12–16 hours. This reduces the amount of chylomicra, whose NMR spectra are similar to VLDL and which is present in variable amounts in non-fasting donors. The blood is drawn into a purple-topped Vacutainer tube containing ethylenediaminetetraacetic acid (EDTA) and it is then immediately placed on ice. The blood sample is centrifuged at 4° C. for ten minutes at 1,000 x g within four hours after being drawn. The separated blood plasma is pipetted off into a plastic tube, and 0.5 ml is transferred to a 5 mm outside diameter NMR tube. The plasma sample is then refrigerated at 4° C. until the NMR analysis is performed, which should be within 48 hours of its collection.

The above procedure is used to collect sample plasma for both analysis according to the present invention and for analysis in order to establish reference NMR spectra of the four constituents. As indicated above, the reference NMR spectra are required in order to practice the present invention. As long as the NMR measurement conditions remain constant, however, the same reference NMR spectra may continue to be employed to analyze further blood plasma samples.

The reference NMR spectra must first be obtained for each of the four constituents of blood plasma: VLDL, LDL, HDL and Proteins. Plasma is obtained as described above and sodium azide ($N_aN_3$) is added to a 30 ml sample to give a concentration of 0.05% by weight. The sample plasma is then fractionated into four constituents of different densities by sequential flotation ultracentrifugation at 10° C. as described by V. N. Schumaker and D. L. Puppione, "Sequential Flotation Ultracentrifugation", *Methods in Enzymology*, Vol. 128, pp. 155–170, Academic Press, New York, 1986. The four constituents are defined as follows: VLDL (d<1.006 g/ml), LDL (d=1.006 to 1.063), HDL (d=1.063 to 1.21), and Protein (d>1.21). More specifically, the procedure is to divide the plasma into two groups, #1 and #2. No adjustment is made of the density of #1 (d=1.006) and the density of #2 is adjusted to 1.063 g/ml by addition of the appropriate volume of a concentrated solution of sodium bromide (NaBr). The two groups of plasma are centrifuged in 2 ml plastic tubes at 50,000 rpm in a Beckman 50.3 Ti ultracentrifuge rotor for 18 hours. The top fraction of #1 containing pure VLDL is removed and stored at 4° C. The density of the bottom fraction of #1 (containing LDL, HDL, and Protein) is adjusted to d=1.063 (#3) and the bottom fraction of #2 (containing HDL and Protein) is adjusted to d=1.21 (#4). These two groups of samples are recentrifuged at 50,000 rpm for 24 hours. The top fraction of #3 contains pure LDL, the top fraction of #4 contains HDL, and the bottom fraction of #4 contains Protein.

At this point, the solutions of the four separated plasma constituents still contain certain small molecular weight metabolites, whose methyl proton NMR signals appear in the same spectral region as the desired lipid methyl and methylene resonances. These compounds, which would interfere with the lineshape analysis, are removed by repeated ultrafiltration of the four component lipoprotein solutions at 4° C. in a Centricon 10 microconcentrator manufactured by Amicon Corp. After each 5-fold concentration step, the lipoprotein solutions are diluted to their original concentration with a "mock" plasma solution of 0.08M NaBr, 0.05M sodium phosphate, 0.005M EDTA, 0.001M $CaCl_2$, pH 7.4. Aliquots (0.5 ml) of each sample constituent are placed in 5 mm NMR tubes and stored at 4° C. until analysis.

The NMR spectra of the four reference lipoprotein constituents are now acquired. They are stored in computer memory and the lineshapes and amplitudes of their methyl and methylene lipid resonances serve as the references used in the lineshape fitting process that is employed to deconvolute blood plasma samples. Since the lineshapes and amplitudes of the NMR spectra depend quite sensitively on the NMR measurement parameters, most notably magnetic field strength and temperature, it is essential that the lipoprotein reference spectra be acquired under the same measurement conditions to be used when measuring the whole plasma samples.

In the preferred embodiment, the NMR measurements are conducted at 250 MHz using an unmodified commercial spectrometer, model WM250 manufactured by Bruker Instruments, Inc. A fixed-frequency 5 mm $^1H$ probe is installed and the temperature controller is set to 23° C. ($\pm 0.5°$ C). Field homogeneity is optimized by shimming on a sample of 99.8% $D_2O$ until the spectral linewidth of the HDO NMR signal is less than 0.6 Hz. The 90° RF excitation pulse width is set to a value of 5.5±0.2 microseconds for the $D_2O$ measurement.

Figure 4:
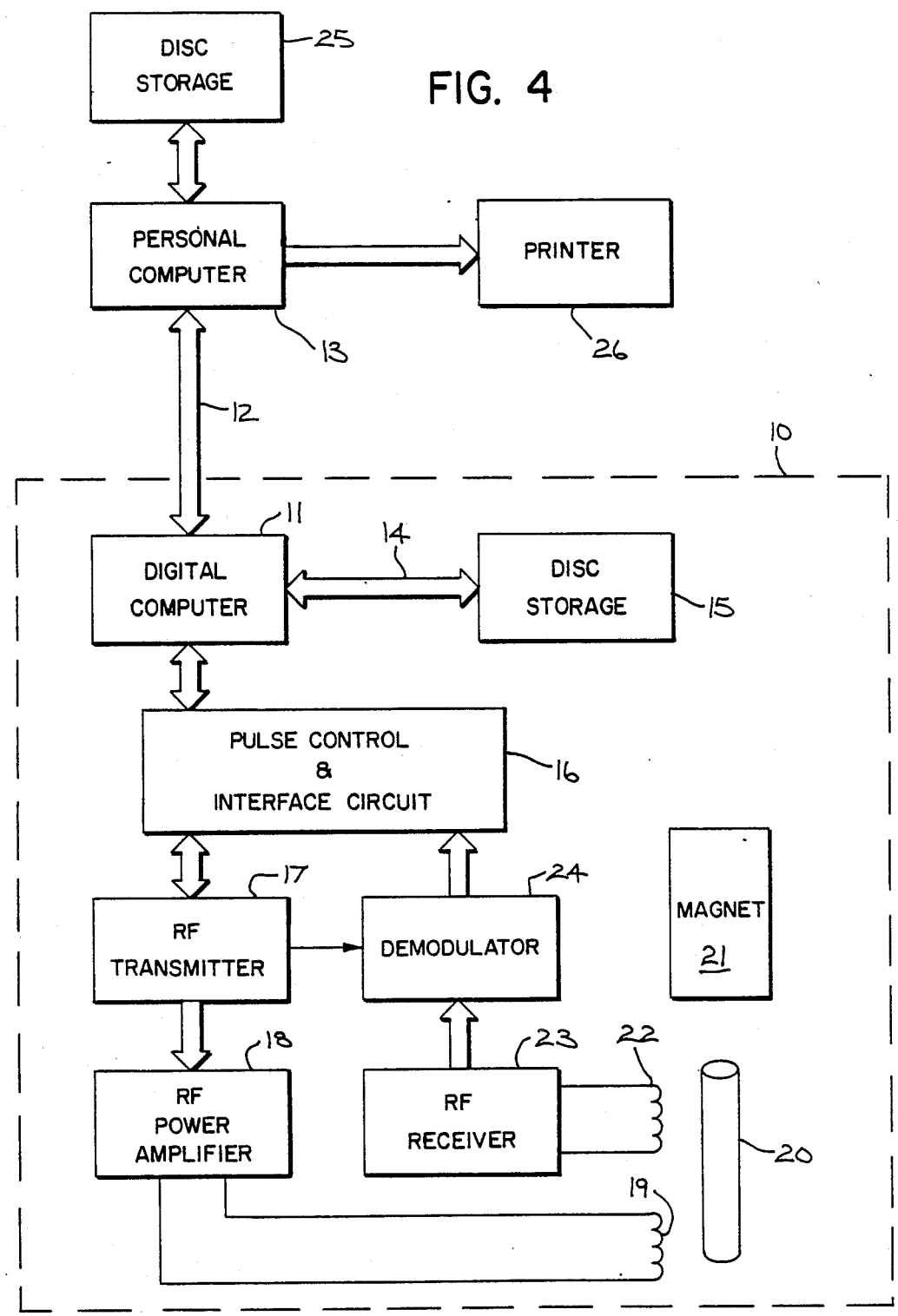
FIG. 4 is a block diagram of the apparatus employed to practice the present invention.

Referring particularly to FIG. 4, the spectrometer indicated by dashed line 10 is controlled by a digital computer 11. The computer 11 is sold under the trade name "ASPECT 2000" and it has a 24-bit word length and storage for 80 K words. It is particularly well suited for performing fast Fourier transformations and includes for this purpose a hard-wired sine table and hard-wired multiply and divide circuit. It also includes a data link 12 to an external personal computer 13, and a direct-memory-access channel 14 which connects to a hard disc unit 15.

The digital computer 11 also includes a set of analog-to-digital converters, digital-to-analog converters and slow device I/O ports which connect through a pulse control and interface circuit 16 to the operating elements of the spectrometer. These elements include an RF transmitter 17 which produces an RF excitation pulse of the duration, frequency and magnitude directed by the digital computer 11, and an RF power amplifier 18 which amplifies the pulse and couples it to the RF transmit coil 19 that surrounds sample tube 20. The NMR signal produced by the excited sample in the presence of a 5.875 Tesla polarizing magnetic field produced by superconducting magnet 21 is received by a coil 22 and applied to an RF receiver 23. The amplified and filtered NMR signal is demodulated at 24 and the resulting quadrature signals are applied to the interface circuit 16 where they are digitized and input through the digital computer 11 to a file in the disc storage 15.

After the NMR data is acquired from the sample in the tube 20, it is processed by the computer 11 to produce another file which is stored in the disc storage 15. This second file is a digital representation of the chemical shift spectrum and it is subsequently read out to the personal computer 13 for storage in its disc storage 25. Under the direction of a program stored in its memory, the personal computer 13 processes the chemical shift spectrum in accordance with the teachings of the present invention to print a report which is output to a printer 26.

It should be apparent to those skilled in the art that the functions performed by the personal computer 13 and its separate disc storage 25 may also be incorporated into the functions performed by the spectrometer's digital computer 11. In such case, the printer 26 is connected directly to the digital computer 11. Prior to their measurement, the 0.5 ml reference samples are removed from the refrigerator and allowed to rise to a temperature of 23° C. for a period of from ten minutes to two hours. A sealed coaxial insert (Wilmad, Cat.#WGS-8BL) containing an external standard used for field-frequency lock and normalization of the plasma signal amplitudes is placed into each plasma NMR sample tube before the spectrum is run. The composition of this standard insert is 0.008M TSP (sodium 3-trimethyl [2,2,3,3-$^2$H$_4$] propionate), 0.6 mM MnSO$_4$, 99.8% D$_2$O. The D$_2$O provides the field-frequency lock signal and the integrated area of the TSP resonance is used to normalize the amplitudes of the plasma lipid resonances to correct for variations in spectrometer detection sensitivity. The solution is doped with Mn$^{2+}$ to paramagnetically broaden the normally sharp TSP resonance to make its integrated area insensitive to small differences in field homogeneity and to shorten its T$_1$ relaxation time to a value comparable to those of the plasma lipid resonances (200 to 500 milliseconds). The reference sample containing the coaxial insert is placed at a defined depth in the sample tube and placed in the spectrometer. The sample is spun at a rate of 20 Hz. After locking on the D$_2$O signal from the coaxial insert, a brief shimming of the z and z$^2$ gradient controls is performed using the NMR signal of the plasma water.

The reference spectrum is then acquired using a standard one-pulse sequence preceded by a one second selective decoupler presaturation pulse of the strong H$_2$O resonance. A spatially selective composite 90° observation pulse (90$_x$-90$_y$-90$_{-x}$-90$_{-y}$) is used to minimize water suppression artifacts as described by A. Bax, "A Spatially Selective Composite 90° Radiofrequency Pulse", in J. Magn. Reson., 65, 142–145 (1985), although a normal 90° pulse also gives satisfactory results. The following acquisition parameters are used: 240 transients (4 dummy scans), 4 K data size, quadrature detection, 2800 Hz spectral width (9.9 to −1.2 ppm), 0.73 sec. acquisition time, 1.0 sec. decoupler presaturation pulse (0.2 watt) at the H$_2$O frequency, 22 microsecond composite 90° pulse, and constant receiver gain for all spectra. The time-domain spectra (FIDs) of the four lipoprotein reference samples are digitized and stored on computer disk.

The reference sample FIDs are processed identically to give the frequency-domain spectra used for the plasma lineshape fitting analysis The processing operations of Fourier transformation, phasing, and baseline correction are accomplished using the standard commercial software of the NMR spectrometer (Bruker "DISNMR" program). The FIDs are Fourier transformed using 16K data points after application of a 1.0 Hz linebroadening exponential multiplication function. All spectra are scaled identically. The spectra are then phase corrected to give pure absorption mode signals.

The chemical shift scales of the four lipoprotein reference spectra cannot be referenced to the Ca-EDTA resonance because the ionic composition of these reference samples is different than plasma (owing to the ultracentrifugation process). The shifts of the methyl and methylene resonances of the lipoproteins and that of Ca-EDTA have been shown to be differently affected by ionic strength, and systematic measurement of the magnitude of this effect has enabled the "real" chemical shifts of the methyl and methylene resonances of the lipoprotein constituents in whole plasma to be determined. These chemical shifts are given below and are used to reference the shift scales of the four lipoprotein reference spectra.

|  | VDVL | LDL | HDL | Protein |
|---|---|---|---|---|
| CH$_2$ Shift (ppm) | 1.233 | 1.220 | 1.186 | 1.235, 1.175 |
| CH$_3$ Shift (ppm) | 0.839 | 0.823 | 0.796 | 0.895, 0.843 |

A linear baseline correction is then applied to flatten the baseline between 1.8 and −0.2 ppm and the Fourier transformed, phased, and baseline corrected spectra are transferred to a personal computer model PC-AT manufactured by IBM Corporation and stored on its disk.

The system is now ready to measure plasma samples. The procedure is virtually the same as that described above for measurement of the reference samples. The same NMR spectrometer is used and it is set up to operate in the identical fashion used to acquire the lipoprotein reference spectra. The time domain spectrum (FID) of the plasma sample is acquired in the identical fashion as the reference spectra and it is processed in nearly the identical manner to produce a digitized representation of the blood plasma sample spectrum in the disk of the personal computer. The only difference in this processing is that the whole plasma spectra can be accurately referenced to the sharp NMR resonance peak produced by the calcium complex of EDTA which is present in the sample. The entire spectrum is shifted as needed to align this peak at 1.519 ppm on the horizontal scale.

The personal computer stores a program which fits the lineshape of the sample plasma spectrum by a weighted linear combination of the four lipoprotein reference spectra. Both the real and imaginary parts of the spectra are used to make the fit in order to correct for unavoidable small relative phase differences between the sample plasma spectrum and the lipoprotein reference spectra. Accurate lineshape analysis also depends on correct alignment of the methyl and methylene region of the sample plasma spectrum with the same spectral region of the four reference spectra (whose relative alignments with respect to one another are fixed). Small chemical shift differences among plasma samples of slightly different ionic composition are compensated for in the program by systematically moving the sample plasma and reference spectra relative to each other one data point at a time to find the minimum root mean square deviation between the actual measured spectrum and the calculated plasma spectrum.

The mathematics used in the lineshape fitting process (i.e. least squares fit of an unknown function in terms of a weighted sum of known functions) is well known and is described in many textbooks of numerical analysis such as F.B. Hildebrand, *Introduction to Numerical Analysis*, 2nd edition, pp. 314–326, 539–567, McGraw-Hill, 1975. A program for performing this function on a PC-AT computer is disclosed in the Appendix. The data points of the real part of the sample plasma spectrum which comprise the spectral region to be fit (normally 1.33–0.70 ppm) are entered into an array. This plasma array consists of m discrete data points denoted $P_i^o$, $i=1,2,\ldots m$. The data points of both the real and imaginary parts of the four lipoprotein reference spectra for the same spectral region are entered into separate arrays. The data points of these arrays are denoted $V_{ji}^R$ and $V_{ji}^I$ for the real and imaginary parts, respectively, where $i=1,2,\ldots m$ data points and $j=1,1,\ldots n$ constituents ($n=4$ if only the four lipoprotein constituents are used in the fit and $n=7$ if the three non-lipoprotein constituents of FIG. 3 are added to the analysis).

The method for fitting the measured sample plasma spectrum, $P_i^o$, with a linear combination of n constituent spectra is based on the premise that there are a set of coefficients (weighting factors), $c_j^R$ and $c_j^I$, corresponding to the real and imaginary contributions of component j to the observed spectrum such that for each data point $$P_i^o \approx \sum_{j=1}^{n} c_j^R V_{ji}^R + \sum_{j=1}^{n} c_j^I V_{ji}^I = P_i^c \text{ (calculated plasma spectrum)}$$

The best fit will be achieved when the root mean square error, $$\sqrt{\frac{1}{m-n}(\Sigma \epsilon_i^2)}$$

is minimized, where $\gamma_i = P_i^o - P_i^c$. This will be accomplished by finding those coefficients which minimize $\Sigma \gamma_i^2$, that is, when $$\frac{\partial \Sigma \epsilon_i^2}{\partial c_j} = 0,$$

$j=1,2,\ldots 2n$ (n real plus n imaginary contributions). Differentiation results in 2n simultaneous linear equations:

$$\sum_{i=1}^{m} P_i^o V_{ki} = \sum_{j=1}^{2n} c_j \left( \sum_{i=1}^{m} V_{ki} V_{ji} \right), k=1,2,\ldots 2n$$

If we let $$a_{kj} = \sum_{i=1}^{m} V_{ki} V_{ji}, \text{ and } S_k = \sum_{i=1}^{m} P_i^o V_{ki}$$

then there are 2n simultaneous linear equations of the form:

$$\sum_{j=1}^{2n} c_j a_{kj} = S_k, k=1,2,\ldots 2n$$

Forming the $2n \times 2n$ matrix, $[A]=[a_{kj}]$, $j=1,2\ldots 2n$; $k=1,2\ldots 2n$, gives $[A]c=s$, where c and s are the column vectors, $$\begin{bmatrix} c_1^R \\ c_2^R \\ \cdot \\ \cdot \\ c_n^R \\ c_1^I \\ \cdot \\ \cdot \\ c_n^I \end{bmatrix} \text{ and } \begin{bmatrix} S_1 \\ S_2 \\ \cdot \\ \cdot \\ S_{2n} \end{bmatrix}$$

The coefficients providing the best fit are calculated by matrix inversion, $$c = [A]^{-1} s$$

The root mean square deviation (RMSD) is computed as $$\sigma_{RMS} = \sqrt{\frac{1}{m-n} \sum_{i=1}^{m} (P_i^o - P_i^c)^2}$$

To compensate for improper alignment of the sample plasma data array with respect to the reference data arrays, the sample plasma data set is moved one data point at a time in both directions with respect to the reference data. New coefficients and root mean square deviations are calculated for each alignment to find the best fit (minimum RMSD). For each constituent j there has thus been calculated a real and imaginary coefficient, $c_j^R$ and $C_j^I$. The net weighting coefficient for each constituent is, therefore, given by:

$$c_j = \sqrt{(c_j^R)^2 + (c_j^I)^2}$$

and its phase by $$\phi_j = \tan^{-1}(c_j^I/c_j^R).$$

The total phase shift of the calculated plasma spectrum versus that of the measured plasma spectrum is given by:

$$\phi = \tan^{-1}\left(\sum_{j=1}^{n} c_j^I \bigg/ \sum_{j=1}^{n} c_j^R\right)$$

The component coefficients resulting from this lineshape analysis provide the concentrations of the four lipoprotein constituents in each plasma sample. Each concentration is expressed relative to the concentration of the lipoprotein whose spectrum is used as the reference. The final concentrations are normalized to the integrated area of the resonance from the TSP external standard to correct for variations in the detection sensitivity of the NMR spectrometer.

The information derived from the above procedure, which is very rapid (minutes) and requires almost no sample manipulation, is equivalent to that provided by acquiring separate spectra of the four components prepared by ultracentrifugation (days) and comparing the integrals of their lipid NMR signals to those of reference lipoprotein samples. It is important to note that what is being measured by this procedure (NMR signal amplitude originating from the "mobile" lipid molecules in each class of lipoprotein) is related to, but fundamentally different from, lipoprotein lipid and protein concentrations derived by the various chemical and immunochemical assays in current clinical use. There is thus no reason to expect a perfect correlation to exist between these NMR-derived lipoprotein levels and those derived from standard serum cholesterol and triglyceride analyses. Despite well documented limitations in the accuracy and precision of the latter measurements, they are in widespread clinical use because of their proven value in assessing coronary heart disease risk and other lipid-related disease states. It is possible that lipoprotein levels derived from the NMR lineshape deconvolution process may have even greater diagnostic utility, but this will not be known until extensive clinical correlation studies have been performed.

To address the question of whether the lineshape deconvolution process gives an accurate indication of the concentrations of the plasma constituents, I have analyzed a series of artificial plasma samples prepared by mixing together defined quantities of the four lipoprotein constituents. As shown in Table 2 below, good agreement is obtained between the known concentrations of the four constituents in each sample and those calculated by the computer lineshape deconvolution process.

Plasma samples were prepared by mixing together defined volumes of buffered saline solution and concentrated stock solutions of VLDL, LDL, HDL, and Protein (bottom fraction) isolated by ultracentrifugation of pooled plasma from several donors. 250 MHz spectra (240 scans, 1 sec. presaturation) were taken at 23° of both the known plasma samples and the stock lipoprotein solutions and were processed with a 1 Hz linebroadening window function and baseline flattened between 1.8 and −0.2 ppm. After transfer of the spectra to a PC-AT computer, lineshape analysis was performed on the region of the spectrum containing the methyl and methylene lipid signals of the known plasma spectra by deconvoluting the signal as described above in terms of the amplitudes of the signals of the 4 lipoprotein constituents present in each plasma sample expressed relative to the concentrations of the stock lipoprotein solutions whose spectral amplitudes serve as reference standards. Table 2 presents the component lipoprotein concentrations calculated by lineshape analysis (Calc) compared to the true, known concentrations (True) in the different plasma samples. Triglyceride (TG) and total cholesterol (Chol) contents of the four reference lipoproteins were directly assayed and the lipid contents of the plasma samples were calculated based on their known lipoprotein compositions.

As indicated above, the accuracy of the method can be improved by considering other blood plasma constituents in the analysis. More specifically, the metabolites: lactate, valine, and hydroxybutyrate produce small, but discernable proton NMR signals as illustrated in FIG. 3. As with the four lipoprotein constituents, these metabolite constituents can be separated and reference NMR spectra produced for each. These additional constituents are then added to the deconvolution process as described above to more accurately determine the concentrations of the lipoprotein constituents in the sample blood plasma.

It should be apparent to those skilled in the art that many variations are possible from the above-described preferred embodiment of the invention. For example, the polarizing field strength may be increased to further spread the NMR spectrum and to thereby improve the resolution of the deconvolution process. Also, the measurements may be conducted at other temperatures. Regardless of the magnetic field strength or the measurement temperature which is chosen, it is important that the chosen values remain constant throughout the process of producing the reference spectra and the sample spectra.

TABLE 2

| | | | Deconvolution of Known Plasma Spectra at 250 MHz | | | | | | |
|---|---|---|---|---|---|---|---|---|---|
| | | | VLDL | | LDL | | HDL | | PROTEIN |
| Sample | TG | Chol | Calc | True | Calc | True | Calc | True | Calc | True |
| FPL5 | 133 | 116 | .23 | .25 | .25 | .25 | .23 | .25 | .26 | .25 |
| FPL6 | 91 | 112 | .16 | .15 | .26 | .25 | .23 | .25 | .31 | .25 |
| FPL7 | 124 | 81 | .25 | .25 | .20 | .15 | .23 | .25 | .33 | .25 |
| FPL8 | 131 | 108 | .24 | .25 | .27 | .25 | .17 | .15 | .26 | .25 |
| FPL9 | 122 | 73 | .24 | .25 | .16 | .15 | .16 | .15 | .28 | .25 |

APPENDIX

```
DEFDBL A-H,O-Z
DEFINT I-N
DIM MSG$(20),RC$(20)
DIM YLAB$(11),LPP(6),LPQ$(6)
```

```
COMMON SHARED /MESS/ MSG$(),RC$(),RET$,NRET,NLAG
COMMON SHARED /PRNT/ PIC$,ELI$,CMP$,FF$,NPT,NPCT,NPG
COMMON SHARED /ALPH1/ XTLT,CL$,CR$,LF$,ECO$,QO$,CO$,XTIM
COMMON SHARED /ONE/ PL(1),VLD(1),FLD(1),HDL(1),PRO(1),PAT(1),PTR(1)
COMMON SHARED /TWO/ AM(2),AI(2),C(1),S(1),P(1),A(1),M(1),L(1),PLT(1)
COMMON SHARED /TRE/ VIM(1),VLR(1),VIR(1),FIM(1),FIR(1),PRM(1)
COMMON SHARED /FOU/ FLR(1),HIM(1),HDR(1),HIR(1),PRP(1),PPR(1),PIR(1)
COMMON SHARED /FIV/ JCS(1),JCSS(1),AMS(2),CCON(1),PIN(1),PIM(1),FILS
COMMON SHARED /SIX/ Z(2),SE(1)
FIL$="NONE!!"
LPQ$(1)="EXPTL. PLASMA"
LPQ$(2)="CALCD. PLASMA"
LPQ$(3)="VLDL"
LPQ$(4)="LDL"
LPQ$(5)="HDL"
LPQ$(6)="PROTEIN"
COLOR 15,1:CLS
MSG$(1)="                        PLFIT"
MSG$(2)=" "
MSG$(3)="           NMR LIPOPROTEIN ANALYSIS         "
MSG$(4)=" "
MSG$(5)=" "
MSG$(6)="ENTER RETURN (0) FOR PARAMETERS TO USE DEFAULT VALUES!"
MSG$(7)=" "
MSG$(8)=" "
MSG$(9)="                DENNIS W. BENNETT"
MSG$(10)="                 1988 VERSION"
CALL MESSAG
SCLMX=-100000:SCLMN=100000
KK=5    'KK = NUMBER OF PARAMETERS TO VARY -- C(1)......C(K)
INPR=0:BLIN$="":LSP=23:CO$=CHR$(58):U$=CHR$(24):D$=CHR$(25)
BK$=" ":FOR I=1 TO 79:BLIN$=BLIN$+BK$:NEXT I
BKIN$="                                  ":QO$=CHR$(34)
BLK$="            "
P1X=1122:P1Y=1000:P2X=9763:P2Y=6466:NSPLT=1
XT$="XT;":YT$="YT;":CP$="CP":LB$="LB":IP$="IP":VS$="VS"
SP$="SP":IN$="IN":SC$="SC":IT$=CHR$(59):LT$=CHR$(3)
CS=",":PA$="PA,":PR$="PR,":PU$="PU,":PD$="PD,":TL$="TL"
XMN=0:XMX=10:YMN=0:YMX=10
DEF FNXY$(X,Y)=STR$(X)+CS+STR$(Y)
DEF FNN$(N)=RIGHT$(STR$(N),LEN(STR$(N))-1)+CS
DEF FNPU$(X,Y)=PA$+PU$+FNXY$(X,Y)+IT$
DEF FNPD$(X,Y)=PA$+PD$+FNXY$(X,Y)+IT$
P1X$=FNN$(P1X):P1Y$=FNN$(P1Y):P2X$=FNN$(P2X):P2Y$=FNN$(P2Y)
XMN$=FNN$(XMN):XMX$=FNN$(XMX):YMN$=FNN$(YMN):YMX$=FNN$(YMX)
NVIN=1:NLIN=1:NHIN=1:NPIN=1
CLOSE #1:OPEN "PLPCON" FOR APPEND AS #1:CLOSE #1
OPEN "PLPCON" FOR INPUT AS #1
IF EOF(1)=0 THEN 101
STD=90000:NLBS=45:NRBS=45:NTSP=7240  'TSP INTEGRAL STANDARD
VLDLS$="VLDL":LDLS$="LDL":HDLS$="HDL":PROTS$="PROT":FILSS
NSTOR=6280        'BEGINNING DATA POINT FOR INPUT DATA
NVLST=6278        'BEGINNING OF DATA READ IN FROM VLDL FILE
NLDST=6279        'BEGINNING OF DATA READ IN FROM LDL FILE
NHDST=6278        'BEGINNING OF DATA READ IN FROM HDL FILE
NPRST=6305        'BEGINNING OF DATA READ IN FROM PROT FILE
NMTS1=6230        'BEGINNING OF METHYLENE REGION IN PLASMA FILE
NMTS2=6395        'ENDING OF METHYLENE REGION IN PLASMA FILE
NMES1=6543        'BEGINNING OF METHYL REGION IN NZX POINT ARRAY
NMES2=6726        'ENDING OF METHYL REGION IN NZX POINT ARRAY
VD=.01            'BASELINE ROTATION FACTOR
PCOMS$="COM2:9600,S,7,1,RS,CS65535,DS,CD"
NZX=1000:KK=5
CLOSE #1:OPEN "PLPCON" FOR OUTPUT AS #1
PRINT #1,VLDLS$
PRINT #1,LDLS$
PRINT #1,HDLS$
PRINT #1,PROTS$
PRINT #1,FILS$
PRINT #1,QO$;PCOMS$;QO$
PRINT #1,NSTOR;NVLST;NLDST;NHDST;NPRST
```

```
        PRINT #1,NMTS1;NMTS2;NMES1;NMES2
        PRINT #1,VD;NZX;KK
        PRINT #1,STD;NLBS;NRBS;NTSP
        CLOSE #1
        GOTO 102
101     INPUT #1,VLDL$
        INPUT #1,LDL$
        INPUT #1,HDL$
        INPUT #1,PROT$
        INPUT #1,FIL$
        INPUT #1,PCOM$
        INPUT #1,NSTOR,NVLST,NLDST,NHDST,NPRST
        INPUT #1,NMTS1,NMTS2,NMES1,NMES2
        INPUT #1,VD,NZX,KK
        INPUT #1,STD,NLBS,NRBS,NTSP
        CLOSE #1
102     NZQ=NZX+200   '100 POINT BUFFER ON EACH SIDE
        NZP=NZX+100:NZ5=500
        DIM PL(NZQ),VLD(NZQ),FLD(NZQ),PLT(NZQ)
        DIM HDL(NZQ),PRO(NZQ),PAT(NZQ),PTR(NZQ)
        DIM VIM(NZQ),VLR(NZQ),VIR(NZQ),FIM(NZQ),FLR(NZQ),FIR(NZQ)
        DIM HIM(NZQ),HDR(NZQ),HIR(NZQ),PRR(NZQ),PRM(NZQ),PIR(NZQ)
        DIM Z(KK,NZ5),AM(KK,KK),AI(KK,KK),C(KK),S(KK),P(NZQ),A(NZQ),M(NZQ),L(NZQ)
        DIM JCS(KK),JCSS(KK),AMS(KK,KK),CCON(KK),PIN(NZQ),PIM(NZQ),SE(KK)
171     CLS
        MSG$(1)="                    ENTER OPTION:"
        MSG$(2)=" "
        MSG$(3)="F. CONTINUE WITH PROGRAM --> FIT DATA!!!!!"
        MSG$(4)="L. SELECT DATA FILE AND LIPOPROTEIN FILE PARAMETERS."
        MSG$(5)="N. SELECT NON-LIPID FILE PARAMETERS."
        MSG$(6)="A. AUTO-INTEGRATE TSP PEAK & COMPUTE CONC. FACTOR."
        MSG$(7)="I. VIEW/INTEGRATE SPECTRUM."
        MSG$(8)="D. VIEW DIRECTORY."
        MSG$(9)="M. MODIFY STANDARD & DEFAULT PARAMETERS."
        MSG$(10)="X. EXIT PROGRAM."
        NRET=8:RC$(1)="L":RC$(2)="N":RC$(3)="I":RC$(4)="D":RC$(5)="M"
        RC$(6)="F":RC$(7)="X":RC$(8)="A":CALL MESSAG
        IF RET$="X" THEN 778
        IF RET$="A" THEN 119
        IF RET$<>"F" THEN 5555
        IF FIL$<>"NONE!!" THEN 6666
        MSG$(1)="YOU HAVE NOT SELECTED A DATA FILE!!"
        CALL MESSAG
        GOTO 111
5555    IF RET$<>"I" THEN 113
        NSTE=NSTOR
        CALL PLOTPL(NSTE)
        NDIN=1
        SCREEN 0:COLOR 15,1:CLS
        GOTO 171
113     IF RET$<>"D" THEN 114
        MSIN$="ENTER DRIVE LETTER -->"
        INPR=0:CALL SETIN(INPR)
        LSP=24
        CALL INPT(MSIN$,LSP)
        LOCATE 11,LSP,0:INPUT DRV$
        DRV$=LEFT$(DRV$,1):DRV$=DRV$+":"
        CLS
        SHL$="DIR "+DRV$+"/P"
        SHELL SHL$
        LOCATE 24,45,0:PRINT "Strike a key when ready . . .";
1010    A$=INKEY$:IF A$="" THEN 1010
        CLS
        GOTO 171
114     IF RET$<>"M" THEN 115
        CALL DEFLT
        CLOSE #1:OPEN "PLPCON" FOR INPUT AS #1
        INPUT #1,VLDL$
        INPUT #1,LDL$
        INPUT #1,HDL$
        INPUT #1,PROT$
```

```
            INPUT #1,FILX$
            INPUT #1,PCOM$
            INPUT #1,NSTOR,NVLST,NLDST,NHDST,NPRST
            INPUT #1,NMTS1,NMTS2,NMES1,NMES2
            INPUT #1,VD,NZX,KK
            INPUT #1,STD,NLBS,NRBS,NTSP
            CLOSE #1
            GOTO 171
115         IF RET$="L" THEN 111
            IF RET$="N" THEN 112
            GOTO 171
111         VLDL$=VLDLS$
            LDL$=LDLS$
            HDL$=HDLS$
            PROT$=PROTS$
            FIL$=FILS$
            NSTEN=NSTOR+NZX-1
            NVLND=NVLST+NZX-1
            NLDND=NLDST+NZX-1
            NHDND=NHDST+NZX-1
            NPRND=NPRST+NZX-1
            MSG$(1)="         FILE DATA --> SELECT LETTER TO MODIFY:"
            MSG$(2)=" "
            MSG$(3)="         FILE/DATA NAME          START              END"
            MSG$(4)=" "
            FFF$=FILS$+"                        ":FFF$=LEFT$(FFF$,24)
            FFF$="D.       "+FFF$
            MSG$(5)=FFF$+STR$(NSTOR)+"          "+ STR$(NSTEN)
            FFF$=VLDLS$+"                       ":FFF$=LEFT$(FFF$,24)
            FFF$="V.       "+FFF$
            MSG$(6)=FFF$+STR$(NVLST)+"          "+ STR$(NVLND)
            FFF$=LDLS$+"                        ":FFF$=LEFT$(FFF$,24)
            FFF$="L.       "+FFF$
            MSG$(7)=FFF$+STR$(NLDST)+"          "+ STR$(NLDND)
            FFF$=HDLS$+"                        ":FFF$=LEFT$(FFF$,24)
            FFF$="H.       "+FFF$
            MSG$(8)=FFF$+STR$(NHDST)+"          "+ STR$(NHDND)
            FFF$=PROTS$+"                       ":FFF$=LEFT$(FFF$,24)
            FFF$="P.       "+FFF$
            MSG$(9)=FFF$+STR$(NPRST)+"          "+ STR$(NPRND)
            MSG$(10)="METHYLENE REGION         "+STR$(NMTS1)
            MSG$(10)=MSG$(10)+"          "+ STR$(NMTS2)
            MSG$(10)="A.       "+MSG$(10)
            MSG$(11)="METHYL REGION            "+STR$(NMES1)
            MSG$(11)=MSG$(11)+"          "+ STR$(NMES2)
            MSG$(11)="B.       "+MSG$(11)
            VVX=CSNG(VD)
            MSG$(12)="N.       NON-LIPID PARAMETERS."
            MSG$(13)="C.       CONTINUE -- SELECTIONS COMPLETE."
            NRET=9:RC$(1)="D":RC$(2)="V":RC$(3)="L":RC$(4)="H":RC$(5)="P"
            RC$(6)="A":RC$(7)="B":RC$(8)="C":RC$(9)="N":CALL MESSAG
            IF RET$="N" THEN 112
            IF RET$="C" THEN 171
            IF RET$<>"D" THEN 6659
            NDIN=1
            MSIN$="ENTER NAME OF PLASMA DATA FILE:"
            INPR=0:CALL SETIN(INPR)
            LSP=24
            CALL INPT(MSIN$,LSP)
            CUR$=FILS$:GOSUB 2345
            LOCATE 11,LSP,0:INPUT FIL$
            IF FIL$="" THEN FIL$=FILS$
            FILS$=FIL$
            CLS
            MSIN$="ENTER STARTING DATA POINT # FOR PLASMA DATA:"
            INPR=0:CALL SETIN(INPR)
            LSP=18
            CALL INPT(MSIN$,LSP)
            CUR$=STR$(NSTOR):GOSUB 2345
            LOCATE 11,LSP,0:INPUT NSTR
            CLS
```

```
      IF NSTR=0 THEN NSTR=NSTOR
      NSTOR=NSTR
      CLS
      GOTO 111
6659  IF RET$<>"V" THEN 6658
      NVIN=1
      MSIN$="ENTER NAME OF VLDL COMPONENT FILE:"
      INPR=0:CALL SETIN(INPR)
      LSP=22
      CALL INPT(MSIN$,LSP)
      CUR$=VLDLS$:GOSUB 2345
      LOCATE 11,LSP,0:INPUT VLDL$
      IF VLDL$="" THEN VLDL$=VLDLS$
      VLDLS$=VLDL$
      CLS
      MSIN$="ENTER STARTING DATA POINT # FOR VLDL DATA:"
      INPR=0:CALL SETIN(INPR)
      LSP=19
      CALL INPT(MSIN$,LSP)
      CUR$=STR$(NVLST):GOSUB 2345
      LOCATE 11,LSP,0:INPUT NVSTR
      CLS
      IF NVSTR=0 THEN NVSTR=NVLST
      NVLST=NVSTR
      GOTO 111
6658  IF RET$<>"L" THEN 6657
      NLIN=1
      MSIN$="ENTER NAME OF LDL COMPONENT FILE:"
      INPR=0:CALL SETIN(INPR)
      LSP=23
      CALL INPT(MSIN$,LSP)
      CUR$=LDLS$:GOSUB 2345
      LOCATE 11,LSP,0:INPUT LDL$
      IF LDL$="" THEN LDL$=LDLS$
      LDLS$=LDL$
      CLS
      MSIN$="ENTER STARTING DATA POINT # FOR LDL DATA:"
      INPR=0:CALL SETIN(INPR)
      LSP=19
      CALL INPT(MSIN$,LSP)
      CUR$=STR$(NLDST):GOSUB 2345
      LOCATE 11,LSP,0:INPUT NLSTR
      CLS
      IF NLSTR=0 THEN NLSTR=NLDST
      NLDST=NLSTR
      GOTO 111
6657  IF RET$<>"H" THEN 6656
      NHIN=1
      MSIN$="ENTER NAME OF HDL COMPONENT FILE:"
      INPR=0:CALL SETIN(INPR)
      LSP=22
      CALL INPT(MSIN$,LSP)
      CUR$=HDLS$:GOSUB 2345
      LOCATE 11,LSP,0:INPUT HDL$
      IF HDL$="" THEN HDL$=HDLS$
      HDLS$=HDL$
      CLS
      MSIN$="ENTER STARTING DATA POINT # FOR HDL DATA:"
      INPR=0:CALL SETIN(INPR)
      LSP=19
      CALL INPT(MSIN$,LSP)
      CUR$=STR$(NHDST):GOSUB 2345
      LOCATE 11,LSP,0:INPUT NHSTR
      CLS
      IF NHSTR=0 THEN NHSTR=NHDST
      NHDST=NHSTR
      GOTO 111
6656  IF RET$<>"P" THEN 6655
      NPIN=1
      MSIN$="ENTER NAME OF PROTEIN COMPONENT FILE:"
      INPR=0:CALL SETIN(INPR)
```

```
            LSP=21
            CALL INPT(MSIN$,LSP)
            CUR$=PROTS$:GOSUB 2345
            LOCATE 11,LSP,0:INPUT PROT$
            IF PROT$="" THEN PROT$=PROTS$
            PROTS$=PROT$
            CLS
            MSIN$="ENTER STARTING DATA POINT # FOR PROTEIN DATA:"
            INPR=0:CALL SETIN(INPR)
            LSP=17
            CALL INPT(MSIN$,LSP)
            CUR$=STR$(NPRST):GOSUB 2345
            LOCATE 11,LSP,0:INPUT NPSTR
            CLS
            IF NPSTR=0 THEN NPSTR=NPRST
            NPRST=NPSTR
            GOTO 111
 6655       IF RET$<>"B" THEN 6654
            NAIN=1
            MSIN$="ENTER STARTING DATA POINT FOR METHYL REGION:"
            INPR=0:CALL SETIN(INPR)
            LSP=18
            CALL INPT(MSIN$,LSP)
            CUR$=STR$(NMES1):GOSUB 2345
            LOCATE 11,LSP,0:INPUT NME1
            CLS
            MSIN$="ENTER ENDING DATA POINT FOR METHYL REGION:"
            INPR=0:CALL SETIN(INPR)
            LSP=19
            CALL INPT(MSIN$,LSP)
            CUR$=STR$(NMES2):GOSUB 2345
            LOCATE 11,LSP,0:INPUT NME2
            IF NME1=0 THEN NME1=NMES1
            IF NME2=0 THEN NME2=NMES2
            NMES1=NME1
            NMES2=NME2
            CLS
            GOTO 111
 6654       IF RET$<>"A" THEN 111
            MSIN$="ENTER STARTING DATA POINT FOR METHYLENE REGION:"
            INPR=0:CALL SETIN(INPR)
            LSP=18
            CALL INPT(MSIN$,LSP)
            CUR$=STR$(NMTS1):GOSUB 2345
            LOCATE 11,LSP,0:INPUT NMT1
            CLS
            MSIN$="ENTER ENDING DATA POINT FOR METHYLENE REGION:"
            INPR=0:CALL SETIN(INPR)
            LSP=17
            CALL INPT(MSIN$,LSP)
            CUR$=STR$(NMTS2):GOSUB 2345
            LOCATE 11,LSP,0:INPUT NMT2
            IF NMT1=0 THEN NMT1=NMTS1
            IF NMT2=0 THEN NMT2=NMTS2
            NMTS1=NMT1
            NMTS2=NMT2
            CLS
            GOTO 111
 112        'MENU FOR NON-LIPID PARAMETERS
            'INCLUDE L. --> 111
            GOTO 171
 119        IF FIL$<>"NONE!!" THEN 1616
            MSG$(1)="YOU HAVE NOT SELECTED A DATA FILE!!"
            CALL MESSAG
            GOTO 111
 1616       NST=641
            MSIN$="ENTER NAME OF FILE CONTAINING TSP PEAK -->"
            INPR=0:CALL SETIN(INPR)
            LSP=19
            CALL INPT(MSIN$,LSP)
            LOCATE 11,LSP,0:INPUT FILI$
            IF FILI$="" THEN FILI$=FIL$
```

```
       CLS
       NSCR=0
       GOSUB 1617
       GOTO 171
1617   CLOSE #1:OPEN FILI$ AS #1 LEN=4
       FIELD 1,4 AS S$
       NEND=NSTR+NZQ-1
       N1=NST+NSTR*2:N2=NST+NEND*2
       K=0
       FOR I=N1 TO N2 STEP 2
       K=K+1
       GET 1,I
       GOSUB 300
       PIN(K)=V/1000
       NEXT I
       CLOSE #1
       NTOP=NTSP-NSTR
       NLF=NTOP-150:NRT=NTOP+150
       TMAX=-100000
       FOR K=NLF TO NRT
       IF PIN(K)<TMAX THEN 69
       TMAX=PIN(K)
       NTOP=K
69     NEXT K
       IPX1=NTOP-NLBS:IPX2=NTOP-NRBS
       TENS2=100*PIN(IPX2):TENS1=100*PIN(IPX1)
       ARPK=0
       SLP=(TENS2-TENS1)/(IPX2-IPX1)
       B=TENS1-(SLP*IPX1)
       FOR I=IPX1 TO IPX2-1
       J=I+1
       B1=(SLP*I)+B
       B2=(SLP*J)+B
       H1=100*PIN(I)-B1
       H2=100*PIN(J)-B1
       HR=H1:IF H2<H1 THEN HR=H2
       AT=ABS(H2-H1):AT=AT/2
       AR=HR+AT
       ARPK=ARPK+AR
       NEXT I
       RNORM=STD/ARPK
       IF NSCR<>0 THEN RETURN
       ARP$=STR$(ARPK)
       LDP=INSTR(ARP$,".")
       ARP$=LEFT$(ARP$,LDP-1)
       MSG$(1)="TSP PEAK INTEGRATED FOR "+FILI$
       MSG$(2)=" "
       MSG$(3)="INTEGRAL ="+ARP$
       MSG$(4)=" "
       MSG$(5)="TOP OF PEAK LOCATED AT"+STR$(NSTR+NTOP)
       MSG$(6)="PEAK INTEGRATED FROM"+STR$(NSTR+IPX1)+" TO"+STR$(NSTR+IPX2)
       MSG$(7)="INTEGRAL NORMALIZATION FACTOR ="
       CALL MESAG
       LOCATE 14,56,0:PRINT USING "##.###";RNORM;
       LOCATE 24,28,0:PRINT "PRESS ANY KEY TO CONTINUE";
6497   A$=INKEY$:IF A$="" THEN 6497
       CLS
       RETURN
2345   LOCATE 2,22,0:PRINT "PRESS RETURN TO RETAIN ----> ";CUR$
       RETURN
6666   MSG$(1)="DO YOU INTEND TO USE THE PLOTTER?"
       MSG$(2)=" "
       MSG$(3)="         Y. YES     N. NO"
       NRET=2:RC$(1)="Y":RC$(2)="N":CALL MESSAG
       NPLOT=0
       IF RET$="N" THEN 6661
       NPLOT=1
       MSG$(1)="TURN PLOTTER ON AND INSTALL PAPER!"
       CALL MESSAG
       CLOSE #1:OPEN PCOM$ AS #1
       PLOT$=IN$+IT$+IPS+P1X$+P1Y$+P2X$+P2Y$+IT$
```

```
              PLOT$=PLOT$+SC$+XMN$+XMX$+YMN$+YMX$+IT$
              PRINT #1,PLOT$                                    'INITIALIZE
              PLOT$="PS"+"10"+IT$                               'PAPER SIZE = 8.5 X 11
              PRINT #1,PLOT$
              PLOT$=SP$+FNN$(1)+IT$:PRINT #1,PLOT$
              PLOT$=VS$+"9.5;":PRINT #1,PLOT$                   'SELECT PEN VELOCITY
              PRINT #1,PLOT$
              PRINT #1,"SP;"                                    'STORE PEN
              CLOSE #1
       6661   MSG$(1)="DO YOU INTEND TO USE THE PRINTER?"
              MSG$(2)=" "
              MSG$(3)="         Y. YES      N. NO"
              NRET=2:RC$(1)="Y":RC$(2)="N":CALL MESSAG
              NPRNT=0
              IF RET$="N" THEN 6662
              NPRNT=1
              MSG$(1)="TURN PRINTER ON AND ALIGN PAPER IF NECESSARY!"
              CALL MESSAG
       6662   IF NVIN=0 THEN 9090
              NVIN=0
              CLOSE #1:OPEN VLDL$ AS #1 LEN=4
              FIELD 1,4 AS S$
              NST=641:STOR=0
              N1=NST+NVLST*2-200:N2=NST+NVLND*2+200
              K=0
              FOR I=N1 TO N2 STEP 2
              K=K+1
              GET 1,I
              GOSUB 300
              VLD(K)=V/1000
              VLR(K)=V/1000
              GET 1,I+1
              GOSUB 300
              VIM(K)=V/1000       'IMAGINARY PART OF SPECTRUM
              VIR(K)=V/1000       'IMAGINARY PART OF SPECTRUM
              NVL=K
              NEXT I
       9090   IF NLIN=0 THEN 9089
              NLIN=0
              CLOSE #1:OPEN LDL$ AS #1 LEN=4
              FIELD 1,4 AS S$
              N1=NST+NLDST*2-200:N2=NST+NLDND*2+200
              K=0
              FOR I=N1 TO N2 STEP 2
              K=K+1
              GET 1,I
              GOSUB 300
              FLD(K)=V/1000
              FLR(K)=V/1000
              GET 1,I+1
              GOSUB 300
              FIM(K)=V/1000       'IMAGINARY PART OF SPECTRUM
              FIR(K)=V/1000       'IMAGINARY PART OF SPECTRUM
              NLD=K
              NEXT I
       9089   IF NHIN=0 THEN 9097
              NHIN=0
              CLOSE #1:OPEN HDL$ AS #1 LEN=4
              FIELD 1,4 AS S$
              N1=NST+NHDST*2-200:N2=NST+NHDND*2+200
              K=0
              FOR I=N1 TO N2 STEP 2
              K=K+1
              GET 1,I
              GOSUB 300
              HDL(K)=V/1000
              HDR(K)=V/1000
              GET 1,I+1
              GOSUB 300
              HIM(K)=V/1000       'IMAGINARY PART OF SPECTRUM
              HIR(K)=V/1000       'IMAGINARY PART OF SPECTRUM
```

```
           NHD=K
           NEXT I
  9097     IF NPIN=0 THEN 1112
           NPIN=0
           CLOSE #1:OPEN PROT$ AS #1 LEN=4
           FIELD 1,4 AS S$
           N1=NST+NPRST*2-200:N2=NST+NPRND*2-200
           K=0
           FOR I=N1 TO N2 STEP 2
           K=K+1
           GET 1,I
           GOSUB 300
           PRO(K)=V/1000
           PRR(K)=V/1000
           GET 1,I+1
           GOSUB 300
           PRM(K)=V/1000      'IMAGINARY PART OF SPECTRUM
           PIR(K)=V/1000      'IMAGINARY PART OF SPECTRUM
           NPO=K
           NEXT I
  1112     NMT1=NMTS1-NVLST+101:NMT2=NMTS2-NVLST+101
           NME1=NMES1-NVLST+101:NME2=NMES2-NVLST+101
           FOR I=1 TO KK:JCS(I)=0:NEXT I
           JST=51
           NREG=3
  499      MSG$(1)="SELECT OPTIONS (* ==> CURRENT OPTION):"
           MSG$(2)=" "
           MSG$(3)="A. FIT METHYL REGION"
           IF NREG=1 THEN MSG$(3)="A. FIT METHYL REGION *"
           MSG$(4)="B. FIT METHYLENE REGION"
           IF NREG=2 THEN MSG$(4)="B. FIT METHYLENE REGION *"
           MSG$(5)="C. FIT BOTH REGIONS"
           IF NREG=3 THEN MSG$(5)="C. FIT BOTH REGIONS *"
           MSG$(6)="D. CONSTRAIN COMPONENT(S)"
           IF NCN=1 THEN MSG$(6)="D. CONSTRAIN COMPONENT(S) *"
           MSG$(7)="Z. FIT DATA"
           MSG$(8)="R. RETURN TO MAIN MENU"
           NRET=6:RC$(1)="A":RC$(2)="B":RC$(3)="C":RC$(4)="D":RC$(5)="Z"
           RC$(6)="R"
           CALL MESSAG
           IF RET$="R" THEN 171
           IF RET$<>"A" THEN 401
           NREG=1:GOTO 499
  401      IF RET$<>"B" THEN 402
           NREG=2:GOTO 499
  402      IF RET$<>"C" THEN 403
           NREG=3:GOTO 499
  403      IF RET$<>"D" THEN 411
           NCN=1-NCN:GOTO 499
  411      NPSC=0
           IF NCN=0 THEN 234
  349      MSG$(1)="WHICH COMPONENT CONCENTRATIONS DO YOU WISH TO CONSTRAIN?"
           MSG$(2)=" "
           MSG$(3)="              V. VLDL"
           IF JCS(1)<>0 THEN MSG$(3)="              V. VLDL *"
           MSG$(4)="              L. LDL"
           IF JCS(2)<>0 THEN MSG$(4)="              L. LDL *"
           MSG$(5)="              H. HDL"
           IF JCS(3)<>0 THEN MSG$(5)="              H. HDL *"
           MSG$(6)="              P. PROTEIN"
           IF JCS(4)<>0 THEN MSG$(6)="              P. PROTEIN *"
           MSG$(7)="              A. NO CONSTRAINTS"
           MSG$(8)="              C. CONTINUE --> SELECTIONS COMPLETE"
           NRET=6:RC$(1)="V":RC$(2)="L":RC$(3)="H":RC$(4)="P"
           RC$(5)="A":RC$(6)="C":CALL MESSAG
           IF RET$="C" THEN 339
           IF RET$<>"V" THEN 341
           JCS(1)=1:JCS(5)=1:GOTO 349
  341      IF RET$<>"L" THEN 342
           JCS(2)=1:JCS(6)=1:GOTO 349
  342      IF RET$<>"H" THEN 343
```

```
          JCS(3)=1:JCS(7)=1:GOTO 349
343   IF RET$<>"P" THEN 344
          JCS(4)=1:JCS(8)=1:GOTO 349
344   FOR I=1 TO KK:JCS(I)=0:NEXT I
          GOTO 234
339   FOR I=1 TO KK
          IF JCS(I)=0 THEN 369
          IF I=1 THEN CPT$="VLDL"
          IF I=2 THEN CPT$="LDL"
          IF I=3 THEN CPT$="HDL"
          IF I=4 THEN CPT$="PROTEIN"
          CSS$=STR$(CCON(I))
          MSIN$="ENTER VALUE OF "+CPT$+" TO FIX (ENTER ==> "+CSS$+"):"
          INPR=0:CALL SETIN(INPR)
          LSP=14
          CALL INPT(MSIN$,LSP)
          LOCATE 11,LSP,0:INPUT CS$
          IF CS$="" THEN C(I)=CCON(I) ELSE C(I)=VAL(CS$)
          IF CS$="" THEN C(I+4)=CCON(I+4) ELSE C(I)=0.0
          CLS
369   NEXT I
234   IF NDIN=0 THEN 238
          NDIN=0
          IF FIL$<>"NONE!!" THEN 246
          MSG$(1)="DATA FILE MUST BE SPECIFIED!!"
          CALL MESSAG
          GOTO 111
246   CLOSE #1:OPEN FIL$ AS #1 LEN=4
          FIELD 1,4 AS S$
          NEND=NSTR+NZX-1
          N1=NST+NSTR*2-200:N2=NST+NEND*2+200
          K=0
          FOR I=N1 TO N2 STEP 2
          K=K+1
          GET 1,I
          GOSUB 300
          PAT(K)=V/1000
          PTR(K)=V/1000
          NEXT I
          CLOSE #1
          PPMX=-100000
          FOR I=101 TO NZP
          IF PAT(I)>PPMX THEN PPMX=PAT(I)
          NEXT I
          RMSMN=1000000
' ***********  OPTIMIZE BASELINE POSITION --> 1 DATA PT*************
238   MSG$(1)="FITTING DATA!":CALL MESAG
          NMQ1=NME1:NMQ2=NME2:NMR1=NMT1:NMR2=NMT2
          NMX1=NME1:NMX2=NME2:NMY1=NMT1:NMY2=NMT2
          GOSUB 2000
          LOCATE 18,26,0:PRINT "RMSD --> ";:PRINT USING "####.##############";RMS
          JP=51
2011  K=JP-1
          FOR I=51 TO NZP
          K=K+1
          IF K<1 THEN 2012
          IF K>NZP THEN 2012
          VLD(I)=VLR(K):VIM(I)=VIR(K)
          FLD(I)=FLR(K):FIM(I)=FIR(K)
          HDL(I)=HDR(K):HIM(I)=HIR(K)
          PRO(I)=PRR(K):PRM(I)=PIR(K)
2012  NEXT I
          LOCATE 18,26,0:PRINT "RMSD --> ";:PRINT USING "####.##############";RMS
          DLTA=JP-51
          NME1=NMX1-DLTA:NME2=NMX2-DLTA:NMT1=NMY1-DLTA:NMT2=NMY2-DLTA
          GOSUB 2000
          LOCATE 18,26,0:PRINT "RMSD --> ";:PRINT USING "####.##############";RMS
          IF RMS>RMSMN THEN 2013
          RMSMN=RMS:JST=JP:JP=JP+1
          GOTO 2011
2013  JP=50
```

```
2014  K=JP-1
      FOR I=51 TO NZP
      K=K+1
      IF K<1 THEN 2015
      IF K>NZP THEN 2015
      VLD(I)=VLR(K):VIM(I)=VIR(K)
      FLD(I)=FLR(K):FIM(I)=FIR(K)
      HDL(I)=HDR(K):HIM(I)=HIR(K)
      PRO(I)=PRR(K):PRM(I)=PIR(K)
2015  NEXT I
      LOCATE 18,26,0:PRINT "RMSD --> ";:PRINT USING "####.#############";
      DLTA=JP-51
      NME1=NMX1-DLTA:NME2=NMX2-DLTA:NMT1=NMY1-DLTA:NMT2=NMY2-DLTA
      GOSUB 2000
      LOCATE 18,26,0:PRINT "RMSD --> ";:PRINT USING "####.#############";
      IF RMS>RMSMN THEN 2016
      RMSMN=RMS:JST=JP:JP=JP-1
      GOTO 2014
2016  K=JST-1
      RMS=RMSMN
      FOR I=51 TO NZP
      K=K+1
      IF K<1 THEN 2020
      IF K>NZP THEN 2020
      VLD(I)=VLR(K):VIM(I)=VIR(K)
      FLD(I)=FLR(K):FIM(I)=FIR(K)
      HDL(I)=HDR(K):HIM(I)=HIR(K)
      PRO(I)=PRR(K):PRM(I)=PIR(K)
2020  NEXT I
      DLTA=JST-51
      NME1=NMX1-DLTA:NME2=NMX2-DLTA:NMT1=NMY1-DLTA:NMT2=NMY2-DLTA
      GOSUB 2000
      GOTO 2500
2000  II=0
531   PATMX=-100000:PATMN=100000
      IF NREG<2 THEN 2001
      FOR I=NMT1 TO NMT2
      IF PAT(I)>PATMX THEN PATMX=PAT(I)
      II=II+1
      P(II)=PAT(I):Z(1,II)=VLD(I):Z(2,II)=FLD(I):Z(3,II)=HDL(I):Z(4,II)=PRO(I)
      Z(5,II)=VIM(I):Z(6,II)=FIM(I):Z(7,II)=HIM(I):Z(8,II)=PRM(I)
      NEXT I
      IF NREG<>3 THEN 2002
2001  FOR I=NME1 TO NME2
      IF PAT(I)>PATMX THEN PATMX=PAT(I)
      II=II+1
      P(II)=PAT(I):Z(1,II)=VLD(I):Z(2,II)=FLD(I):Z(3,II)=HDL(I):Z(4,II)=PRO(I)
      Z(5,II)=VIM(I):Z(6,II)=FIM(I):Z(7,II)=HIM(I):Z(8,II)=PRM(I)
      NEXT I
2002  NZ=II    'NZ = NUMBER OF POINTS TO FIT
'*********** LEAST SQUARES FIT OF LINEAR COMBINATION OF COMPONENTS
      FOR J=1 TO KK
      IF JCS(J)=0 THEN 719
      FOR I=1 TO NZ
      P(I)=P(I)-C(J)*Z(J,I)
      NEXT I
719   NEXT J
      MM=0
      FOR N=1 TO KK
      IF JCS(N)<>0 THEN 701
      MM=MM+1
      NN=0
      FOR J=1 TO KK
      IF JCS(J)<>0 THEN 707
      NN=NN+1
      AM(MM,NN)=0
      FOR I=1 TO NZ
      AM(MM,NN)=AM(MM,NN)+Z(N,I)*Z(J,I)
      NEXT I
707   NEXT J
701   NEXT N
```

```
      NN=0
      FOR N=1 TO KK
      IF JCS(N)<>0 THEN 708
      NN=NN+1
      S(NN)=0
      FOR I=1 TO NZ
      S(NN)=S(NN)+P(I)*Z(N,I)
      NEXT I
708   NEXT N
'     INVERT MATRIX AM --> AI
      NQ=NN
      CALL INVERT(IE,NQ)
      IF IE<>0 THEN 577
      CLS
      MSG$(1)="SINGULAR MATRIX!!"
      CALL MESSAG
      RETURN
'     C=AI*S
'------------------------------
577   FOR I=1 TO KK
      SE(I)=0
      IF JCS(I)<>0 THEN 505
      C(I)=0:SE(I)=AI(I,I)
505   NEXT I
      MM=0
      FOR I=1 TO KK
      IF JCS(I)<>0 THEN 704
      MM=MM+1
      NN=0
      FOR J=1 TO KK
      IF JCS(J)<>0 THEN 716
      NN=NN+1
      C(I)=C(I)+AI(MM,NN)*S(NN)
716   NEXT J
704   NEXT I
      II=0
      FOR I=51 TO NZP:PL(I)=0:NEXT I
      FOR I=NMT1 TO NMT2
      II=II+1
      FOR J=1 TO KK
      PL(I)=PL(I)+C(J)*Z(J,II)
      NEXT J
      NEXT I
      FOR I=NME1 TO NME2
      II=II+1
      FOR J=1 TO KK
      PL(I)=PL(I)+C(J)*Z(J,II)
      NEXT J
      NEXT I
'**** CALCULATE RESIDUAL, RMS DEVIATION, CORRELATION COEFFICIENT
      RES=0:SPT=0:SPL=0:SM1=0:SM2=0:SM3=0
      IF NREG<2 THEN 2005
      FOR I=NMT1 TO NMT2
      PL(I)=C(1)*VLD(I)+C(2)*FLD(I)+C(3)*HDL(I)+C(4)*PRO(I)
      PL(I)=PL(I)+C(5)*VIM(I)+C(6)*FIM(I)+C(7)*HIM(I)+C(8)*PRM(I)
      SPT=SPT+PAT(I):SPL=SPL+PL(I)
      DEL=PL(I)-PAT(I):RES=RES+DEL*DEL
      NEXT I
      IF NREG<>3 THEN 2006
2005  FOR I=NME1 TO NME2
      PL(I)=C(1)*VLD(I)+C(2)*FLD(I)+C(3)*HDL(I)+C(4)*PRO(I)
      PL(I)=PL(I)+C(5)*VIM(I)+C(6)*FIM(I)+C(7)*HIM(I)+C(8)*PRM(I)
      SPT=SPT+PAT(I):SPL=SPL+PL(I)
      DEL=PL(I)-PAT(I):RES=RES+DEL*DEL
      NEXT I
2006  VRC=RES/(NZ)
      RMS=SQR(VRC)  'ROOT MEAN SQUARE DEVIATION
      PVT=SPT/NZ:PVL=SPL/NZ
      IF NREG<2 THEN 3005.
      FOR I=NMT1 TO NMT2
      SM1=SM1+((PAT(I)-PVT)*(PL(I)-PVL))
```

```
        SM2=SM2+((PAT(I)-PVT)^2)
        SM3=SM3+((PL(I)-PVL)^2)
        NEXT I
        IF NREG<>3 THEN 3006
3005    FOR I=NME1 TO NME2
        SM1=SM1+((PAT(I)-PVT)*(PL(I)-PVL))
        SM2=SM2+((PAT(I)-PVT)^2)
        SM3=SM3+((PL(I)-PVL)^2)
        NEXT I
3006    SM2=SM2*SM3:SM2=SQR(SM2)
        CRC=SM1/SM2
        ST=0:CT=0
        KK2=KK/2
        FOR I=1 TO KK2
        CT=CT+C(I)
        SE(I)=SE(I)*VRC
        ST=ST+C(I+KK2)
        SE(I+KK2)=SE(I+KK2)*VRC
        NEXT I
        TT=ST/CT:THT=ATN(TT)*(180/3.14159)
        FOR I=1 TO KK:SE(I)=SQR(SE(I)):NEXT I
        FOR I=1 TO KK2
        CI=C(I)*C(I)+C(I+KK2)*C(I+KK2)
        CIS=SQR(CI)
        SIGI=(1/(2*CIS))*(SE(I)+SE(I+KK2))
        SE(I)=SIGI
        CT=CT+C(I)
        SE(I)=SE(I)*VRC
        ST=ST+C(I+KK2)
        SE(I+KK2)=SE(I+KK2)*VRC
        NEXT I
        RETURN
300     B1=ASC(MID$(S$,1,1))
        B2=ASC(MID$(S$,2,1))
        B3=ASC(MID$(S$,3,1))
        B4=ASC(MID$(S$,4,1))
        SB=B4 AND &H80         'CHECK SIGN BIT ON HIGH BYTE
        IF SB<>0 THEN 500      'NEGATIVE # --> 500
        V=B1+B2*256+B3*256^2+B4*256^3
        RETURN
500     BC1=B1 XOR 255         'SWITCH BITS
        BC2=B2 XOR 255
        BC3=B3 XOR 255
        BC4=B4 XOR 255
        BC1=BC1+1              'CREATE TWOS COMPLEMENT
        IF BC1<256 THEN 600
        BC1=0
        BC2=BC2+1
        IF BC2<256 THEN 600
        BC2=0
        BC3=BC3+1
        IF BC3<256 THEN 600
        BC3=0
        BC4=BC4+1
600     B1=BC1:B2=BC2:B3=BC3:B4=BC4
        V=B1+B2*256+B3*256^2+B4*256^3  'ABS(VV)
        V=-V                   'GET SIGN RIGHT
        RETURN
'***** PLOT **********************
2500    GOSUB 2000
        RMSMN=RMS
        NSCR=1
        FILI$=FIL$
        GOSUB 1617
        ARPQ=ARPK
        NTQP=NTOP
        IPQ1=IPX1:IPQ2=IPX2
        RNQPM=RNORM
        PLMX=-100000
        FOR I=NMT1 TO NMT2
        PL(I)=C(1)*VLD(I)+C(2)*FLD(I)+C(3)*HDL(I)+C(4)*PRO(I)
```

```
     PL(I)=PL(I)+C(5)*VIM(I)+C(6)*FIM(I)+C(7)*HIM(I)+C(8)*PRM(I)
     IF PL(I)>PLMX THEN PLMX=PL(I)
     NEXT I
     FOR I=NME1 TO NME2
     PL(I)=C(1)*VLD(I)+C(2)*FLD(I)+C(3)*HDL(I)+C(4)*PRO(I)
     PL(I)=PL(I)+C(5)*VIM(I)+C(6)*FIM(I)+C(7)*HIM(I)+C(8)*PRM(I)
     IF PL(I)>PLMX THEN PLMX=PL(I)
     NEXT I
     SCLMX=PATMX
     IF PATMX<PLMX THEN SCLMX=PLMX
     CLS
     WF=600:WI=50
     FRG=WF-WI:RINC=FRG/10
     WVG=(WI+WF)/2:WVR=(INT((WVG/.5)+.5))*.5
874  SCREEN 9
     KEY OFF:CLS:WINDOW (-1,-2.5)-(10.5,10.5)
     REM ***** PLOT AXES *****
     LINE (0,-.2)-(0,10),14
     LINE (0,-.2)-(10,-.2),14
     FOR I=1 TO 9:LINE (I,-.4)-(I,0),2:LINE (I+.5,-.3)-(I+.5,-.1),2
     NEXT I:LINE (10,-.4)-(10,0),14:LINE (.5,-.3)-(.5,-.1),14
     FOR I=0 TO 10:LINE (-.1,I)-(.1,I),2
     NEXT I
     LOCATE 6,3,0:PRINT "I";
     LOCATE 7,3,0:PRINT "N";
     LOCATE 8,3,0:PRINT "T";
     LOCATE 9,3,0:PRINT "E";
     LOCATE 10,3,0:PRINT "N";
     LOCATE 11,3,0:PRINT "S";
     LOCATE 12,3,0:PRINT "I";
     LOCATE 13,3,0:PRINT "T";
     LOCATE 14,3,0:PRINT "Y";
     REM ***** PLOT PEAK ******
     FOR I=NMT1 TO NMT2-1:J=I+1
     PX1=5-((WVR-I)/RINC)
     PY1=(10*PL(I))/SCLMX
     PX2=5-((WVR-J)/RINC)
     PY2=(10*PL(J))/SCLMX
     LINE (PX1,PY1)-(PX2,PY2),10
     NEXT I
     FOR I=NME1 TO NME2-1:J=I+1
     PX1=5-((WVR-I)/RINC)
     PY1=(10*PL(I))/SCLMX
     PX2=5-((WVR-J)/RINC)
     PY2=(10*PL(J))/SCLMX
     LINE (PX1,PY1)-(PX2,PY2),10
     NEXT I
     FOR I=NMT1 TO NMT2-1:J=I+1
     PX1=5-((WVR-I)/RINC)
     PY1=(10*PAT(I))/SCLMX
     PX2=5-((WVR-J)/RINC)
     PY2=(10*PAT(J))/SCLMX
     LINE (PX1,PY1)-(PX2,PY2),12
     NEXT I
     FOR I=NME1 TO NME2-1:J=I-1
     PX1=5-((WVR-I)/RINC)
     PY1=(10*PAT(I))/SCLMX
     PX2=5-((WVR-J)/RINC)
     PY2=(10*PAT(J))/SCLMX
     LINE (PX1,PY1)-(PX2,PY2),12
     NEXT I
     IF NPSC<>0 THEN 1020
     TRES=0.0
     FOR I=NMT1 TO NMT2
     PL(I)=C(1)*VLD(I)+C(2)*FLD(I)+C(3)*HDL(I)+C(4)*PRO(I)
     PL(I)=PL(I)+C(5)*VIM(I)+C(6)*FIM(I)+C(7)*HIM(I)+C(8)*PRM(I)
     DEL=PL(I)-PAT(I)
     TRES=TRES+DEL*DEL
     NEXT I
     FOR I=NME1 TO NME2
     PL(I)=C(1)*VLD(I)+C(2)*FLD(I)+C(3)*HDL(I)+C(4)*PRO(I)
```

```
         PL(I)=PL(I)+C(5)*VIM(I)+C(6)*FIM(I)+C(7)*HIM(I)+C(8)*PRM(I)
         DEL=PL(I)-PAT(I):TRES=TRES+DEL*DEL
         NEXT I
         VRC=TRES/NZ
         TRMS=SQR(VRC)   'TOTAL ROOT MEAN SQUARE DEVIATION
         C1PR=C(1)*C(1)+C(5)*C(5):C1PR=SQR(C1PR)
         C2PR=C(2)*C(2)+C(6)*C(6):C2PR=SQR(C2PR)
         C3PR=C(3)*C(3)+C(7)*C(7):C3PR=SQR(C3PR)
         C4PR=C(4)*C(4)+C(8)*C(8):C4PR=SQR(C4PR)
1020     LOCATE 1,35,0:PRINT "VLDL  -->";:PRINT USING "###.###";C1PR
         LOCATE 2,35,0:PRINT "LDL   -->";:PRINT USING "###.###";C2PR
         LOCATE 3,35,0:PRINT "HDL   -->";:PRINT USING "###.###";C3PR
         LOCATE 4,35,0:PRINT "PROT  -->";:PRINT USING "###.###";C4PR
         LOCATE 5,35,0:PRINT "RMSD  -->";:PRINT USING "####.##";RMS;
         LOCATE 6,35,0:PRINT "TSD   -->";:PRINT USING "###.##";TRMS;
         LOCATE 7,35,0:PRINT "CORR  -->";:PRINT USING "##.####";CRC
         LOCATE 8,35,0:PRINT "PHASE -->";:PRINT USING "####.##";THT
         IF NREG=1 THEN RGN$="METHYL REGION FIT"
         IF NREG=2 THEN RGN$="METHYLENE REGION FIT"
         IF NREG=3 THEN RGN$="BOTH REGIONS FIT"
         LOCATE 10,35,0:PRINT RGN$;
         LOCATE 24,28,0:PRINT "PRESS ANY KEY TO CONTINUE";
777      A$=INKEY$:IF A$="" THEN 777
7778     FOR I=1 TO KK:FOR J=1 TO NZ5:Z(I,J)=0:NEXT J:NEXT I
         FOR I=1 TO NZQ:P(I)=0:A(I)=0:M(I)=0:L(I)=0:NEXT I
         FOR I=1 TO KK:FOR J=1 TO KK:AM(I,J)=0:AI(I,J)=0
         NEXT J:NEXT I
         FOR I=1 TO KK:S(I)=0:NEXT I    'CHECK
900      SCREEN 0,0:WIDTH 80:COLOR 15,1:CLS
         MSG$(1)="                    OPTIONS -->"
         MSG$(2)=" "
         MSG$(3)="A. CONTINUE -- FIT NEW DATA."
         MSG$(4)=" "
         MSG$(5)="B. CONTINUE -- FIT CURRENT DATA."
         MSG$(6)=" "
         MSG$(7)="C. PLOT RESULTS ON SCREEN."
         MSG$(8)=" "
         MSG$(9)="D. PLOT RESULTS ON PLOTTER."
         MSG$(10)=" "
         MSG$(11)="E. PRINT RESULTS ON PRINTER."
         MSG$(12)=" "
         MSG$(13)="F. RETURN TO MAIN MENU."
         NRET=6:RC$(1)="A":RC$(2)="B":RC$(3)="C":RC$(4)="D":RC$(5)="E":RC$(6)="F"
         CALL MESSAG
         IF RET$<>"F" THEN 1971
         NDIN=1:NVIN=1:NLIN=1:NHIN=1:NPIN=1
         GOTO 171
1971     IF RET$<>"A" THEN 1111
         NDIN=1
         GOTO 111
1111     IF RET$<>"B" THEN 776
         FOR I=1 TO NVL:VLD(I)=VLR(I):VIM(I)=VIR(I):NEXT I
         FOR I=1 TO NLD:FLD(I)=FLR(I):FIM(I)=FIR(I):NEXT I
         FOR I=1 TO NHD:HDL(I)=HDR(I):HIM(I)=HIR(I):NEXT I
         FOR I=1 TO NPO:PRO(I)=PPR(I):PRM(I)=PIR(I):NEXT I
         JST=101
         RMSMN=100000
         GOTO 499
776      IF RET$<>"D" THEN 773
         IF NPLOT<>0 THEN 762
         BEEP:GOTO 900
762      CLOSE #1:CLOSE #2
         FOR I=1 TO 6:LPP(I)=-1:NEXT I
         NAXS=0    'SET TO 1 TO INDICATE THAT AXES,ETC HAVE BEEN PLOTTED
909      MSG$(1)="PLOT THE FOLLOWING ON THE HP PLOTTER:"
         MSG$(2)=" "
         MSG$(3)="A. EXPERIMENTAL PLASMA SPECTRUM."
         MSG$(4)="B. CALCULATED PLASMA SPECTRUM."
         MSG$(5)="C. CALCULATED VLDL COMPONENT SPECTRUM."
         MSG$(6)="D. CALCULATED LDL COMPONENT SPECTRUM."
         MSG$(7)="E. CALCULATED HDL COMPONENT SPECTRUM."
```

```
     MSG$(8)="F. CALCULATED PROTEIN COMPONENT SPECTRUM."
     MSG$(9)="G. PRINT DATA ON PLOT."
     MSG$(10)="X. EXIT."
     NRET=8:RC$(1)="A":RC$(2)="B":RC$(3)="C":RC$(4)="D":RC$(5)="E":RC$(6)="F"
     RC$(7)="X":RC$(8)="G":CALL MESSAG
     IF RET$<>"X" THEN 6900
     IF NAXS=0 THEN 900
     PLOT$="LT"+IT$:PRINT #1,PLOT$
     PLOT$=PA$+PU$+FNN$(0)+FNN$(0)+PU$+FNN$(0)+FNN$(10)+IT$
     PRINT #1,PLOT$
     PRINT #1,"SP;"                                  'STORE PEN
     CLOSE #1
     GOTO 900
6900 IF RET$<>"A" THEN 881
     FOR I=51 TO NZP:PLT(I)=PAT(I):NEXT I
     LPP(1)=1000
     GOTO 800
881  IF RET$<>"B" THEN 882
     FOR I=51 TO NZP:PLT(I)=PL(I):NEXT I
     LPP(2)=1000
     GOTO 800
882  IF RET$<>"C" THEN 883
     FOR I=51 TO NZP:PLT(I)=C(1)*VLD(I)+C(5)*VIM(I):NEXT I
     LPP(3)=1000
     '------ REMOVE
'     FOR I=1 TO KK:PRINT C(I):NEXT I:INPUT JUNK
'     FOR I=51 TO NZP:PRINT VLD(I),VIM(I),PLT(I):NEXT I
'     INPUT JUNK  '------------ REMOVE
     GOTO 800
883  IF RET$<>"D" THEN 884
     FOR I=51 TO NZP:PLT(I)=C(2)*FLD(I)+C(6)*FIM(I):NEXT I
     LPP(4)=1000
     GOTO 800
884  IF RET$<>"E" THEN 885
     FOR I=51 TO NZP:PLT(I)=C(3)*HDL(I)+C(7)*HIM(I):NEXT I
     LPP(5)=1000
     GOTO 800
885  IF RET$<>"F" THEN 9111
     FOR I=51 TO NZP:PLT(I)=C(4)*PRO(I)+C(8)*PRM(I):NEXT I
     LPP(6)=1000
800  MSG$(1)="SELECT LINE TYPE FOR PLOT:"
     MSG$(2)=" "
     MSG$(3)="A. _____"
     MSG$(4)="B. _ _ _ _ _ _ _ _"
     MSG$(5)="C. ___ ___ ___ ___ _"
     MSG$(6)="D. __ . __ . __ . __"
     MSG$(7)="E. __ __ __ __ __"
     MSG$(8)="F. __ __ __ __ __"
     MSG$(9)="G. .  .  .  .  ."
     NRET=7:RC$(1)="A":RC$(2)="B":RC$(3)="C":RC$(4)="D"
     RC$(5)="E":RC$(6)="F":RC$(7)="G":CALL MESSAG
     IF RET$="A" THEN LNT=0
     IF RET$="B" THEN LNT=2
     IF RET$="C" THEN LNT=3
     IF RET$="D" THEN LNT=4
     IF RET$="E" THEN LNT=5
     IF RET$="F" THEN LNT=6
     IF RET$="G" THEN LNT=1
     FOR I=1 TO 6
     IF LPP(I)<10 THEN 841
     LPP(I)=LNT
841  NEXT I
     CLOSE #1:OPEN PCOM$ AS #1
     PLOT$=IN$+IT$+IP$+P1X$+P1Y$+P2X$+P2Y$+IT$
     PLOT$=PLOT$+SC$+XMN$+XMX$+YMN$+YMX$+IT$
     PRINT #1,PLOT$                                  'INITIALIZE
     PLOT$="PS"+"10"+IT$                             'PAPER SIZE = 8.5 X 11
     PRINT #1,PLOT$
     PLOT$=SP$+FNN$(1)+IT$:PRINT #1,PLOT$
     PLOT$=VS$+"9.5;":PRINT #1,PLOT$                 'SELECT PEN VELOCITY
     PLOT$=PA$+PU$+FNN$(0)+FNN$(0)+PU$+FNN$(0)+FNN$(10)+IT$
```

```
         PRINT #1,PLOT$
         PLOT$=IN$+IT$+IP$+P1X$+P1Y$+P2X$+P2Y$+IT$
         PLOT$=PLOT$+SC$+XMN$+XMX$+YMN$+YMX$+IT$
         PRINT #1,PLOT$                               'INITIALIZE
         PLOT$="PS"+"10"+IT$                          'PAPER SIZE = 8.5 X 11
         PRINT #1,PLOT$
'        PLOTTER PARAMETERS
         PNA=1    ' PEN NUMBER FOR AXES
         PNL=1    'PEN NUMBER FOR LETTERING
         PNS=2    'PEN NUMBER FOR SPECTRA
         IF NAXS<>0 THEN 901
         NAXS=1
         REM ***** PLOT AXES *****
         PLOT$=SP$+FNN$(PNA)+IT$:PRINT #1,PLOT$
         PLOT$=VS$+"9.5;":PRINT #1,PLOT$              'SELECT PEN VELOCITY
         PLOT$=PA$+PU$+FNN$(0)+FNN$(0)+PD$+FNN$(0)+FNN$(10)+IT$
         PRINT #1,PLOT$
         PLOT$=PA$+PU$+FNN$(0)+FNN$(0)+PD$+FNN$(10)+FNN$(0)+IT$
         PRINT #1,PLOT$
         PLOT$=TL$+FNN$(0)+FNN$(.8)+IT$:PRINT #1,PLOT$ 'TIC SIZE
         PRINT #1,FNPU$(0,0)
         FOR I=1 TO 20:P=I/2:PRINT #1,FNPU$(P,0):PRINT #1,XT$:NEXT I
         PRINT #1,FNPU$(0,0)
         FOR I=1 TO 20:P=I/2:PRINT #1,FNPU$(0,P):PRINT #1,YT$:NEXT I
         PLOT$="SR"+"1.5"+CS+"3.0"+IT$:PRINT #1,PLOT$
'         WVN$="WAVENUMBERS":LWV=-LEN(WVN$)/2-.1667
'         PRINT #1,FNPU$(5,-1!)
'         XLBL$=CP$+FNXY$(LWV,0)+IT$+LB$+WVN$+LT$:PRINT #1,XLBL$
         ITL$="INTENSITY":LIT=-LEN(ITL$)/2-.1667
         PRINT #1,FNPU$(-.3,5)
         YLBL$=CP$+FNXY$(LIT,0)+IT$+LB$+ITL$+LT$
         YLBL$ = "DI0,1;"+YLBL$:PRINT #1,YLBL$:PRINT #1,"DI;"
         PLOT$="SR"+"1.0"+CS+"2.5"+IT$:PRINT #1,PLOT$
         YSR=WVR-(5*RINC)
         YLAB$(1)=STR$(YSR):YLAB$(1)=RIGHT$(YLAB$(1),LEN(YLAB$(1))-1)
         FOR J=2 TO 11:I=J-1
         YL=YSR+(I*RINC):YLAB$(J)=STR$(YL):LY=LEN(YLAB$(J))
         YLAB$(J)=RIGHT$(YLAB$(J),LY-1):NEXT J
'         FOR I=0 TO 10:J=11-I:PRINT #1,FNPU$(I,-.3)
'         LXL=LEN(YLAB$(J)):LXL=-LXL/2:TXL=INT(LXL)-LXL
'         IF ABS(TXL)<.00001 THEN LXL=LXL+.1667       CHANGE -- NUMBERS AXIS
'         IF ABS(TXL)>.00001 THEN LXL=LXL-.1667
'         XLBL$=CP$+FNXY$(LXL,0)+LB$+YLAB$(J)+LT$
'         PRINT #1,XLBL$:NEXT I
901      REM ***** PLOT SPECTRUM *****
         PLOT$=SP$+FNN$(PNS)+IT$:PRINT #1,PLOT$        'SELECT PEN
         PLOT$=VS$+"38.1;":PRINT #1,PLOT$              'PEN VELOCITY
         XMN=0:XMX=10:YMN=0:YMX=10000
         XMN$=FNN$(XMN):XMX$=FNN$(XMX):YMN$=FNN$(YMN):YMX$=FNN$(YMX)
         PLOT$=SC$+XMN$+XMX$+YMN$+YMX$+IT$:PRINT #1,PLOT$
'        SELECT LINE TYPE
         LTP$="3.0"  'PERCENTAGE OF DIAGONAL ON PLOT FOR PATTERN
         IF LNT<3 THEN LTP$="2.0"
         IF LNT=1 THEN LPT$="0.5"
         PNL=2       'PEN TYPE FOR PLOT
         IF LNT=1 THEN PNL=1           'DOTS USE BIG PEN
         PLOT$=SP$+FNN$(PNL)+IT$
         PRINT #1,PLOT$       'SELECT PEN
         LNT$="LT"+STR$(LNT)
         IF LNT=0 THEN LTP$=""
         IF LNT=0 THEN LNT$="LT"
         PLOT$=LNT$+C$+LTP$+IT$:PRINT #1,PLOT$
         PX1=5-((WVR-NMT1)/RINC)
         PY1=(10*PLT(NMT1))/SCLMX
         IF PY1>10 THEN PY1=10
         IF PY1<.001 THEN PY1=.001
         PY1=1000*PY1
         PRINT #1,FNPU$(0,10000)
         PRINT #1,FNPU$(PX1,PY1)
         FOR I=NMT1+1 TO NMT2-1:J=I+1
```

```
        PX=5-((WVR-J)/RINC)
        PY=(10*PLT(J))/SCLMX
        IF PY>10 THEN PY=10
        IF PY<.001 THEN PY=.001
        PY=1000*PY
        PRINT #1,FNPD$(PX,PY)
        NEXT I
        PX2=5-((WVR-NME1)/RINC)
        PY2=(10*PLT(NME1))/SCLMX
        IF PY2>10 THEN PY2=10
        IF PY2<.001 THEN PY2=.001
        PY2=1000*PY2
        PRINT #1,FNPU$(PX2,PY2)
        FOR I=NME1+1 TO NME2-1:J=I+1
        PX=5-((WVR-J)/RINC)
        PY=(10*PLT(J))/SCLMX
        IF PY>10 THEN PY=10
        IF PY<.001 THEN PY=.001
        PY=1000*PY
        PRINT #1,FNPD$(PX,PY)
        NEXT I
        PLOT$="LT"+IT$:PRINT #1,PLOT$
        PLOT$=PA$+PU$+FNN$(0)+FNN$(0)+PU$+FNN$(0)+FNN$(10)+IT$
        PRINT #1,PLOT$
        GOTO 909
9111    XMN=0:XMX=10:YMN=0:YMX=10
        XMN$=FNN$(XMN):XMX$=FNN$(XMX):YMN$=FNN$(YMN):YMX$=FNN$(YMX)
        PLOT$=SC$+XMN$+XMX$+YMN$+YMX$+IT$:PRINT #1,PLOT$
        PNL=1        'PEN TYPE
        PLOT$=SP$+FNN$(PNL)+IT$:PRINT #1,PLOT$            'SELECT PEN
        PRINT #1,FNPU$(0,0)
        REM ***** PLOT DATA ON PLOTTER *****
        PLOT$="SR"+IT$:PRINT #1,PLOT$
        PRINT #1,FNPU$(0,0)
        PTIT$=FIL$
        PRINT #1,FNPU$(4.0,12.5)   'LOCATES PEN FOR PRINTING
        LBL$=LB$+PTIT$+LT$:PRINT #1,LBL$
        PRINT #1,CP$+IT$
        PRINT #1,CP$+IT$
        PLOT$=LB$+DATE$+LT$:PRINT #1,PLOT$
        PRINT #1,CP$+IT$
        PLOT$=LB$+TIME$+LT$:PRINT #1,PLOT$
        PRINT #1,CP$+IT$
        PRINT #1,CP$+IT$
        PRINT #1,LB$;"RELATIVE LIPOPROTEIN CONCENTRATIONS:";LT$
        PRINT #1,CP$+IT$
        PRINT #1,CP$+IT$
        PRINT #1,CP$+IT$
        PRINT #1,LB$;"VLDL -->";:PRINT #1,USING "#.###";C1PR;
        PRINT #1,LT$
        PRINT #1,CP$+IT$
        PRINT #1,LB$;"LDL  -->";:PRINT #1,USING "#.###";C2PR;
        PRINT #1,LT$
        PRINT #1,CP$+IT$
        PRINT #1,LB$;"HDL  -->";:PRINT #1,USING "#.###";C3PR;
        PRINT #1,LT$
        PRINT #1,CP$+IT$
        PRINT #1,LB$;"PROT -->";:PRINT #1,USING "#.###";C4PR;
        PRINT #1,LT$
        PRINT #1,CP$+IT$
        PRINT #1,LB$;"RMSD -->";:PRINT #1,USING "###.##";RMS;
        PRINT #1,LT$
        PRINT #1,CP$+IT$
        PRINT #1,LB$;"TSD  -->";:PRINT #1,USING "###.##";TRMS;
        PRINT #1,LT$
        PRINT #1,CP$+IT$
        PRINT #1,LB$;"CORR -->";:PRINT #1,USING "#.###";CRC;
        PRINT #1,LT$
        PRINT #1,CP$+IT$
        PLOT$="LT"+IT$:PRINT #1,PLOT$
        VJP=8.0
```

```
       FOR I=1 TO 6
       IF LPP(I)<0 THEN 3773
       VJP=VJP-.5
       PRINT #1,FNPU$(4.0,VJP)   'LOCATES PEN FOR PRINTING
       LNT=LPP(I)
       LTP$="3.0"   'PERCENTAGE OF DIAGONAL ON PLOT FOR PATTERN
       IF LNT<3 THEN LTP$="2.0"
       IF LNT=1 THEN LPT$="0.5"
       PLOT$=SP$+FNN$(PNL)+IT$
       PRINT #1,PLOT$           'SELECT PEN
       LNT$="LT"+STR$(LNT)
       IF LNT=0 THEN LTP$=""
       IF LNT=0 THEN LNT$="LT"
       PLOT$=LNT$+C$+LTP$+IT$:PRINT #1,PLOT$
       PRINT #1,FNPD$(4.7,VJP):PRINT #1,FNPU$(5.0,VJP)
       PLOT$=LB$+LPQ$(I)+LT$:PRINT #1,PLOT$
3773   NEXT I
       PLOT$=PA$+PU$+FNN$(0)+FNN$(0)+PU$+FNN$(0)+FNN$(10)+IT$
       PRINT #1,PLOT$
       PNL=2       'PEN TYPE
       PRINT #1,"SP;"                              'STORE PEN
       GOTO 900
773    IF RET$<>"E" THEN 874
       IF NPRNT<>0 THEN 766
       BEEP:GOTO 900
766    NPSC=1
       LPRINT:LPRINT:LPRINT:LPRINT:LPRINT
       LPRINT BLK$;"NMR LIPOPROTEIN ANALYSIS FOR ";FIL$
       LPRINT:LPRINT:LPRINT:LPRINT:LPRINT
       LPRINT BLK$;"RELATIVE LIPOPROTEIN CONCENTRATIONS:"
       LPRINT
       LPRINT BLK$;"VLDL  -->";:LPRINT USING "#.#####";C1PR;
       LPRINT "(";:LPRINT USING "#.#####";SE(1);:LPRINT ")"
       LPRINT BLK$;"LDL   -->";:LPRINT USING "#.#####";C2PR;
       LPRINT "(";:LPRINT USING "#.#####";SE(2);:LPRINT ")"
       LPRINT BLK$;"HDL   -->";:LPRINT USING "#.#####";C3PR;
       LPRINT "(";:LPRINT USING "#.#####";SE(3);:LPRINT ")"
       LPRINT BLK$;"PROT  -->";:LPRINT USING "#.#####";C4PR;
       LPRINT "(";:LPRINT USING "#.#####";SE(4);:LPRINT ")"
       LPRINT
       LPRINT
       LPRINT BLK$;"ROOT MEAN SQUARE DEVIATIONS & CORRELATION COEFFICIENTS."
       LPRINT
       LPRINT BLK$;"RMSD FOR TOTAL METHYL & METHYLENE FIT -->";
       LPRINT USING "###.###";TRMS
       IF NREG=3 THEN 765
       IF NREG=1 THEN RGN$="RMSD FOR METHYL REGION (FIT) -->"
       IF NREG=2 THEN RGN$="RMSD FOR METHYLENE REGION (FIT) -->"
       LPRINT BLK$;RGN$;:LPRINT USING "###.###";RMS
765    RGN$="CORRELATION COEFFICIENT -->"
       LPRINT BLK$;RGN$;:LPRINT USING "#.####";CRC
       LPRINT
       LPRINT
       DLTA=JST-51
       NNEW=NSTOR-DLTA
       LPRINT BLK$;"INITIAL STARTING DATA POINT FOR PLASMA -->";NSTOR
       LPRINT BLK$;"STARTING DATA POINT FOR BEST LEAST SQUARES FIT -->";NNEW
       LPRINT
       LPRINT
       LPRINT BLK$;"OPTIONS SELECTED -->"
       LPRINT
       IF NREG=1 THEN LPRINT BLK$;"METHYL REGION (ONLY) FIT."
       IF NREG=2 THEN LPRINT BLK$;"METHYLENE REGION (ONLY) FIT."
       IF NREG=3 THEN LPRINT BLK$;"METHYL AND METHYLENE REGIONS FIT."
       LPRINT
       BLN$="PHASE CORRECTION -->"
       LPRINT
       LPRINT BLK$;BLN$;
       THQ=-THT
       LPRINT USING "###.##";THQ;:LPRINT " DEGREES"
       LPRINT
```

```
7773  IF NCN=0 THEN 7772
      LPRINT
      LPRINT BLK$;"CONSTRAINTS -->"
      LPRINT
      FOR I=1 TO KK
      IF JCS(I)=0 THEN 7369
      IF I<>1 THEN 7301
      LPRINT BLK$;"VLDL COMPONENT CONSTRAINED TO ";:LPRINT USING "#.####";C1PR
7301  IF I<>2 THEN 7302
      LPRINT BLK$;"LDL COMPONENT CONSTRAINED TO ";:LPRINT USING "#.####";C2PR
7302  IF I<>3 THEN 7303
      LPRINT BLK$;"HDL COMPONENT CONSTRAINED TO ";:LPRINT USING "#.####";C3PR
7303  IF I<>4 THEN 7369
      LPRINT BLK$;"PROTEIN COMPONENT CONSTRAINED TO ";
      LPRINT USING "#.####";C4PR
7369  NEXT I
7772  TSPP$=BLK$+"TSP PEAK INTEGRATED FOR "+FIL$
      LPRINT TSPP$
      LPRINT
      LPRINT BLK$;:LPRINT "INTEGRAL --> ";:LPRINT USING "########";ARPQ
      LPRINT
      TSPP$=BLK$+"TOP OF PEAK LOCATED AT"+STR$(NSTR+NTQP)
      LPRINT TSPP$
      TSPP$=BLK$+"PEAK INTEGRATED FROM"+STR$(NSTR+IPQ1)+" TO"+STR$(NSTR+IPQ2)
      LPRINT TSPP$
      LPRINT BLK$;:LPRINT "INTEGRAL NORMALIZATION FACTOR --> ";
      LPRINT USING "###.##";RNQRM
      LPRINT
      LPRINT BLK$;"NORMALIZED LIPOPROTEIN CONCENTRATIONS:"
      LPRINT
      C1PZ=C1PR*RNQRM
      C2PZ=C2PR*RNQRM
      C3PZ=C3PR*RNQRM
      C4PZ=C4PR*RNQRM
      LPRINT BLK$;"VLDL -->";:LPRINT USING "#.####";C1PZ
      LPRINT BLK$;"LDL  -->";:LPRINT USING "#.####";C2PZ
      LPRINT BLK$;"HDL  -->";:LPRINT USING "#.####";C3PZ
      LPRINT BLK$;"PROT -->";:LPRINT USING "#.####";C4PZ
      LPRINT CHR$(12)
      GOTO 7778
7778  END
'*************** MATRIX INVERSION ********************
      SUB INVERT(IERR,NDM) STATIC
'     COPY AM INTO LINEAR ARRAY A
      K=0:N=NDM:IERR=1
      FOR I=1 TO N:FOR J=1 TO N:K=K+1:A(K)=AM(J,I):NEXT J:NEXT I
'
'     SEARCH FOR LARGEST ELEMENT
'
      D=1.0:NK=-N:
      FOR K=1 TO N
      NK=NK+N:L(K)=K:M(K)=K:KK=NK+K:BIGA=A(KK)
      FOR J=K TO N
      IZ=N*(J-1)
      FOR I=K TO N
      IJ=IZ+I
10    TST=ABS(BIGA)-ABS(A(IJ))
      IF TST>=0. THEN 20
      BIGA=A(IJ):L(K)=I:M(K)=J
20    NEXT I
      NEXT J
'
'     INTERCHANGE ROWS
'
      J=L(K):JTST=J-K
      IF JTST<=0 THEN 35
      KI=K-N
      FOR I=1 TO N
      KI=KI+N:HOLD=-A(KI):JI=KI-K+J:A(KI)=A(JI):A(JI)=HOLD
      NEXT I
```

```
'       INTERCHANGE COLUMNS
'
35      I=M(K):JTST=I-K
        IF JTST<=0 THEN 45
        JP=N*(I-1)
        FOR J=1 TO N
        JK=NK+J:JI=JP+J:HOLD=-A(JK):A(JK)=A(JI):A(JI)=HOLD
        NEXT J
45      IF ABS(BIGA)>0.0000001 THEN 48
'
'       SINGULAR MATRIX --> EXIT
'
        D=0.:DET=D:IERR=0
        EXIT SUB
'
'       DIVIDE COLUMN BY MINUS PIVOT (PIVOT IN BIGA)
'
'
48      FOR I=1 TO N
        IF I=K THEN 55
        IK=NK+I
        A(IK)=A(IK)/(-BIGA)
55      NEXT I
'
'       REDUCE MATRIX
'
        FOR I=1 TO N
        IK=NK+I:HOLD=A(IK):IJ=I-N
        FOR J=1 TO N
        IJ=IJ+N
        IF I=K THEN 65
        IF J=K THEN 65
        KJ=IJ-I+K
        A(IJ)=HOLD*A(KJ)+A(IJ)
65      NEXT J
        NEXT I
'
'       DIVIDE ROW BY PIVOT
'
        KJ=K-N
        FOR J=1 TO N
        KJ=KJ+N
        IF J=K THEN 75
        A(KJ)=A(KJ)/BIGA
75      NEXT J
'
'       PRODUCT OF PIVOTS
'
        D=D*BIGA
'
'       REPLACE PIVOT BY RECIPROCAL
'
        A(KK)=1.0/BIGA
        NEXT K
'
'       FINAL ROW & COLUMN INTERCHANGE
'
        K=N
100     K=K-1
        IF K<=0 THEN 150
        I=L(K)
        IF I<=K THEN 120
        JQ=N*(K-1):JR=N*(I-1)
        FOR J=1 TO N
        JK=JQ+J:HOLD=A(JK):JI=JR+J:A(JK)=-A(JI):A(JI)=HOLD
        NEXT J
120     J=M(K)
        IF J<=K THEN 100
        KI=K-N
        FOR I=1 TO N
        KI=KI+N:HOLD=A(KI):JI=KI-K+J:A(KI)=-A(JI):A(JI)=HOLD
```

```
        NEXT I
        GOTO 100
'
'       1/[AM] NOW STORED IN A --> COPY INTO AI
'
150     K=0
        FOR I=1 TO N:FOR J=1 TO N:K=K+1:AI(J,I)=A(K):NEXT J:NEXT I
        END SUB
'-----------------------------------------------------------------
        SUB MESSAG STATIC
        N20=LEN(MSG$(20))/2:N20=40-CINT(N20)
        LOCATE 2,N20,0:PRINT MSG$(20);
        SQ$=CHR$(205)
        LOCATE 5,1,0:PRINT "  ";:FOR I=1 TO 74:PRINT SQ$;:NEXT I
        LOCATE 6,1,0:PRINT "  ";:FOR I=1 TO 74:PRINT SQ$;:NEXT I
        JCT=1:LM=0:FOR I=1 TO 20:LMS=LEN(MSG$(I))
        IF LMS>LM THEN LM=LMS
        IF LMS<.1 THEN 91
        NEXT I
91      NMS=I-1:LC=CINT(40-(LM/2))
        FOR I=1 TO NMS:LL=I+7
        LOCATE LL,LC,0:PRINT MSG$(I);
        NEXT I
        IF NRET>.1 THEN 92
        LL1=LL+2:LL2=LL1+1:LL3=LL2+2:LL4=LL3+2
        LOCATE LL1,1,0:PRINT "  ";:FOR I=1 TO 74:PRINT SQ$;:NEXT I
        LOCATE LL2,1,0:PRINT "  ";:FOR I=1 TO 74:PRINT SQ$;:NEXT I
        IF NLAG >.1 THEN 93
        LOCATE LL3,27,0:PRINT "PRESS ANY KEY TO CONTINUE":
94      RET$=INKEY$:IF RET$="" THEN 94
        IF LEN(RET$)>1 THEN 95
        IF RET$="$" THEN 95
        IF RET$<>ECO$ THEN 95
        STOP
92      LL=LL+2:LL1=LL+2:LL2=LL1-1:LL3=LL2+2:LL4=LL3+2
        LOCATE LL1,1,0:PRINT "  ";:FOR I=1 TO 74:PRINT SQ$;:NEXT I
        LOCATE LL2,1,0:PRINT "  ";:FOR I=1 TO 74:PRINT SQ$;:NEXT I
        MG$="ENTER CHOICE --> ":LOCATE LL,31,0:PRINT MG$;
96      LOCATE LL,49,1:RET$=INKEY$:IF RET$="" THEN 96
        IF LEN(RET$)>1 THEN 911
        IF RET$="$" THEN 95
        LC=ASC(RET$)
        IF RET$<>ECO$ THEN 910
        STOP
910     IF LC>96 THEN RET$=CHR$(LC-32)
        PRINT RET$;:LOCATE 1,1,0
        FOR I=1 TO NRET:IF RET$=RC$(I) THEN 97
        NEXT I
911     BEEP:BEEP:BEEP:FOR I=1 TO 5:FOR J=1 TO 15
        LOCATE LL,55,0:PRINT "WHAT?":NEXT J
        FOR J=1 TO 10:LOCATE LL,55,0:PRINT "      ";:NEXT J
        NEXT I:GOTO 96
97      FOR I=1 TO 500:NEXT I:GOTO 95
93      FOR I=1 TO NLAG:NEXT I
95      FOR I=1 TO 18:MSG$(I)="":NEXT I
        FOR I=1 TO 20:RC$(I)="":NEXT I:NRET=0:NLAG=0
        DUM=FRE(A$)
        CLS:LOCATE 1,1,0
        END SUB
'-----------------------------------------------------------------
        SUB MESAG STATIC
        CLS:SQ$=CHR$(223)
        N20=LEN(MSG$(20))/2:N20=40-CINT(N20)
        LOCATE 2,N20,0:PRINT MSG$(20)
        LOCATE 5,1,0:PRINT "  ";:FOR I=1 TO 74:PRINT SQ$;:NEXT I
        JCT=1:LM=0:FOR I=1 TO 20:LMS=LEN(MSG$(I))
        IF LMS>LM THEN LM=LMS
        IF LMS<.1 THEN 377
        NEXT I
377     NMS=I-1:LC=CINT(40-(LM/2))
```

```
        FOR I=1 TO NMS:LL=I+7
        LOCATE LL,LC,0:PRINT MSG$(I)
        NEXT I
        LL1=LL+2:LL2=LL1+1:LL3=LL2+2:LL4=LL3+2
        LOCATE LL2,1,0:PRINT "   ";:FOR I=1 TO 74:PRINT SQ$;:NEXT I
        FOR I=1 TO 18:MSG$(I)="":NEXT I
        LOCATE 1,1,0
        DUM=FRE(A$)
        END SUB
'-----------------------------------------------------------------------
        SUB SETIN(INPR) STATIC
        IF INPR<.5 THEN 555
        MSG$(1)="         PRINT OPTIONS:"
        MSG$(2)=" ":MSG$(4)="  "
        MSG$(3)="S. PRINT ON SCREEN ONLY.
        MSG$(5)="P. PRINT ON SCREEN AND PRINTER.
        NRET=2:RC$(1)="S":RC$(2)="P"
        CALL MESSAG
        IF RET$="S"THEN 555
        NPT=1
        MSG$(1)="BE CERTAIN PRINTER IS READY AND PAPER IS ALIGNED!"
        CALL MESSAG
555     CLS:SQ$=CHR$(219)
        LOCATE 5,1,0:PRINT "   ";:FOR I=1 TO 74:PRINT SQ$;:NEXT I
        LOCATE 6,1,0:PRINT "   ";:FOR I=1 TO 74:PRINT SQ$;:NEXT I
        LOCATE 14,1,0:PRINT "   ";:FOR I=1 TO 74:PRINT SQ$;:NEXT I
        LOCATE 15,1,0:PRINT "   ";:FOR I=1 TO 74:PRINT SQ$;:NEXT I
33      END SUB
'-----------------------------------------------------------------------
        SUB INPT(MSIN$,LSP) STATIC
        LOCATE 9,1,0:PRINT SPC(79)
        LOCATE 11,1,0:PRINT SPC(79)
        LOCATE 9,LSP,0:PRINT MSIN$;
        DUM=FRE(A$)
        END SUB
```

I claim:

1. A method for measuring the lipoprotein constituents of blood, the steps comprising:
   storing the NMR spectrum of each lipoprotein constituent as a reference spectrum for that constituent;
   acquiring an NMR signal produced by a plasma or serum sample of the blood to be analyzed in an NMR spectrometer;
   producing an NMR spectrum of the sample by transforming the acquired NMR signal;
   producing a calculated lineshape by adding together the reference spectrum for each constituent in amounts determined by respective constituent coefficients;
   adjusting the constituent coefficients to fit the calculated lineshape to the NMR spectrum of the sample; and
   calculating the concentration of at least one lipoprotein constituent as a function of the value of its constituent coefficient.

2. The method as recited in claim 1 in which the lipoprotein constituents are VLDL, LDL, HDL, and proteins.

3. The method as recited in claim I in which the NMR spectrum includes at least one of the peaks produced by methylene and methyl protons.

4. The method as recited in claim 1 in which the NMR spectra are chemical shift spectra and the sample NMR spectrum is produced by:
   performing a Fourier transformation on the acquired NMR signal.

5. The method as recited in claim 4 in which the NMR spectrum of each lipoprotein constituent is produced by:
   (a) separating the lipoprotein constituent from a sample of blood;
   (b) acquiring the NMR signal produced by the separated lipoprotein constituent in an NMR spectrometer; and
   (c) performing a Fourier transformation on the acquired NMR signal to produce the NMR spectrum of the lipoprotein constituent.

6. The method as recited in claim 4 which includes:
   (d) shifting the sample spectrum to align a known peak therein with its known chemical shift value.

7. The method as recited in claim 1 in which the calculated lineshape is fit to the NMR spectra of the sample by minimizing the root mean square error.

8. The method as recited in claim 1 which includes storing the NMR spectrum of a non-lipoprotein constituent as a reference spectrum for that constituent and including the reference spectrum for the non-lipoprotein constituent in the calculated lineshape.

9. The method as recited in claim 1 which includes the step of generating a printed report which indicates the concentration of each calculated lipoprotein constituent.

10. Apparatus for measuring a plurality of lipoprotein constituents of blood comprising:
    means for storing the NMR spectrum of each one of said plurality of lipoprotein constituents as a reference spectrum for that constituent;
    means for acquiring an NMR signal produced by a plasma or serum sample of the blood to be analyzed in an NMR spectrometer;

producing an NMR spectrum of the sample by transforming the acquired NMR signal;

means for producing a calculated lineshape by adding together the reference spectrum for each constituent in amounts determined by respective constituent coefficients;

means for adjusting the constituent coefficients to fit the calculated lineshape to the NMR spectrum of the sample; and means for calculating the concentration of at least one of said plurality of lipoprotein constituents as a function of the value of its constituent coefficient.

11. The apparatus in claim 10 in which the NMR spectra are chemical shift spectra and the sample NMR spectrum is produced by:

performing a Fourier transformation on the acquired NMR signal.

12. The apparatus in claim 10 which includes printer means for producing a report which indicates the concentration of each calculated lipoprotein constituent.

* * * * *